(12) United States Patent
Hikasa

(10) Patent No.: US 10,923,582 B2
(45) Date of Patent: *Feb. 16, 2021

(54) TRENCH-TYPE INSULATED GATE SEMICONDUCTOR DEVICE INCLUDING AN EMITTER TRENCH AND AN OVERLAPPED FLOATING REGION

(71) Applicant: ROHM CO., LTD., Kyoto (JP)

(72) Inventor: Akihiro Hikasa, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 67 days.

This patent is subject to a terminal disclaimer.

(21) Appl. No.: 16/050,416

(22) Filed: Jul. 31, 2018

(65) Prior Publication Data
US 2018/0337270 A1  Nov. 22, 2018

Related U.S. Application Data

(63) Continuation of application No. 15/378,016, filed on Dec. 13, 2016, now Pat. No. 10,062,774, which is a
(Continued)

(30) Foreign Application Priority Data

Aug. 21, 2012 (JP) .................. 2012-182169
Aug. 21, 2012 (JP) .................. 2012-182170
Aug. 12, 2013 (JP) .................. 2013-167478

(51) Int. Cl.
*H01L 29/739* (2006.01)
*H01L 29/40* (2006.01)
(Continued)

(52) U.S. Cl.
CPC ...... *H01L 29/7397* (2013.01); *H01L 29/0619* (2013.01); *H01L 29/0646* (2013.01);
(Continued)

(58) Field of Classification Search
CPC ............ H01L 29/4236; H01L 29/7397; H01L 29/6634; H01L 29/407;
(Continued)

(56) References Cited

U.S. PATENT DOCUMENTS 6,566,691 B1 * 5/2003 Inoue ................ H01L 29/66348
257/133
6,953,968 B2 10/2005 Nakamura et al.
(Continued)

FOREIGN PATENT DOCUMENTS

CN  102244095 A  11/2011
JP  H04-251983 A  9/1992
(Continued)

OTHER PUBLICATIONS

Ikunori Takata (Mitsubishi Electric Corporation): "Fundamental Difference between IGBT Operation and Bipolar Junction Transistor Operation" (with its English-language translation), Oct. 16, 2008, pp. 15-20.
(Continued)

*Primary Examiner* — Matthew C Landau
*Assistant Examiner* — Mark Hatzilambrou
(74) *Attorney, Agent, or Firm* — Gregory M. Howison

(57) ABSTRACT

A semiconductor device is disclosed having a plurality of gate trenches formed on the surface thereof, each filled with a gate insulating film and a gate electrode. A transistor region is defined between adjacent gate trenches forming a pair, and includes an $n^+$-type emitter region, a p-type base region, and an $n^-$-type drift region disposed lateral to each gate trench in the pair, in order in a depth direction of the gate trench from a front surface side of the semiconductor layer. A $p^+$-type collector region disposed on a back surface side of the semiconductor layer with respect to the $n^-$-type drift region. A plurality of emitter trenches are formed one
(Continued)

either side of each of the gate trenches in the pair of gate trenches.

18 Claims, 29 Drawing Sheets

Related U.S. Application Data continuation of application No. 13/969,697, filed on Aug. 19, 2013, now Pat. No. 9,543,421.

(51) Int. Cl.
*H01L 29/417* (2006.01)
*H01L 29/66* (2006.01)
*H01L 29/06* (2006.01)
*H01L 29/10* (2006.01)

(52) U.S. Cl.
CPC .......... *H01L 29/404* (2013.01); *H01L 29/407* (2013.01); *H01L 29/41708* (2013.01); *H01L 29/41766* (2013.01); *H01L 29/6634* (2013.01); *H01L 29/66348* (2013.01); *H01L 29/7395* (2013.01); *H01L 29/0649* (2013.01); *H01L 29/1095* (2013.01)

(58) Field of Classification Search
CPC ....... H01L 29/402–407; H01L 29/7395–7398; H01L 29/66333–66348; H01L 29/404
USPC ........................................................ 257/328
See application file for complete search history.

(56) References Cited

U.S. PATENT DOCUMENTS

| | | | |
|---|---|---|---|
| 7,115,944 B2 | 10/2006 | Nakamura et al. | |
| 7,888,733 B2 | 2/2011 | Suekawa | |
| 8,994,102 B2 | 3/2015 | Hikasa | |
| 9,543,421 B2 | 1/2017 | Hikasa | |
| 10,062,774 B2* | 8/2018 | Hikasa | H01L 29/6634 |
| 2002/0179976 A1 | 12/2002 | Takahashi | |
| 2003/0042537 A1 | 3/2003 | Nakamura et al. | |
| 2003/0160270 A1 | 8/2003 | Pfirsche et al. | |
| 2005/0280029 A1 | 12/2005 | Nakamura et al. | |
| 2007/0267672 A1 | 11/2007 | Hokomoto et al. | |
| 2011/0133312 A1 | 6/2011 | Tooi et al. | |
| 2011/0233684 A1 | 9/2011 | Matsushita | |
| 2012/0292662 A1 | 11/2012 | Matsuura et al. | |

FOREIGN PATENT DOCUMENTS

| | | |
|---|---|---|
| JP | H08-222728 A | 8/1996 |
| JP | 2003-324197 A | 11/2003 |
| JP | 2004-111772 A | 4/2004 |
| JP | 2004-273921 A | 9/2004 |
| JP | 2005-032941 A | 2/2005 |
| JP | 2005191221 A | 7/2005 |
| JP | 2005524970 A | 8/2005 |
| JP | 2005-340626 A | 12/2005 |
| JP | 2006314112 A | 11/2006 |
| JP | 2007-311557 A | 11/2007 |
| JP | 2007-324539 A | 12/2007 |
| JP | 2008-091853 A | 4/2008 |
| JP | 2009-054903 A | 3/2009 |
| JP | 2009-188290 A | 8/2009 |
| JP | 2009206478 A | 9/2009 |
| JP | 2009206478 A | 10/2009 |
| JP | 2009-277792 A | 11/2009 |
| JP | 2010-283128 A | 12/2010 |
| JP | 2011-512677 A | 4/2011 |
| JP | 2011091283 A | 5/2011 |
| JP | 2011091283 A | 6/2011 |
| JP | 4785334 B2 | 7/2011 |
| JP | 2011-165928 A | 8/2011 |
| JP | 2011-181583 A | 9/2011 |
| JP | 2011-204716 A | 10/2011 |
| JP | 2011-204803 A | 10/2011 |
| JP | 2012146810 | 2/2012 |
| JP | 2012-151470 A | 8/2012 |
| JP | 2012-156564 A | 8/2012 |
| JP | 2012146810 | 8/2012 |
| JP | 2012256839 A | 12/2012 |
| JP | 2013-251466 A | 12/2013 |
| JP | 2014039030 A | 2/2014 |
| WO | WO-2010/044135 A1 | 4/2010 |
| WO | WO-2011/111500 A1 | 9/2011 |

OTHER PUBLICATIONS

Satoru Machida, Takahide Sugiyama, and Masayasu Ishiko (Toyota Central R&D Labs., Inc.), and Satoshi Yasuda, Jun Saito and Kimimori Hamada (Toyota Motor Corp.): "Investigation of Correlation between Device Structures and Switching Losses of IGBTs" (with its English-language translation), Oct. 29, 2009, pp. 55-59.
So Watanabe, Mutsuhiro Mori, Taiga Aral, Kohsuke Ishibashi, Yasushi Toyoda, Tetsuo Oda, Takashi Harada, Katsuaki Saito (Hitachi, Ltd.) "1.7kV Trench IGBT with Deep and Separate Floating p-Layer Designed for Low Loss, Low EMI Noise, and High Reliability" (with its English-language translation), Oct. 27, 2011, pp. 67-71.
JP: Office Action of 2018-215949 (related application); dated Jul. 11, 2019; 8 pages.
Notification of Reasons for Refusal of JP Patent Application No. 2018-215949 (Related Application); dated Mar. 1, 2019; 9 Pgs.
Notice of Reasons for Refusal of JP Patent Application 2019-203351 (related application); Tanada, Kazunari; dated Oct. 26, 2020; 8 pages.

* cited by examiner

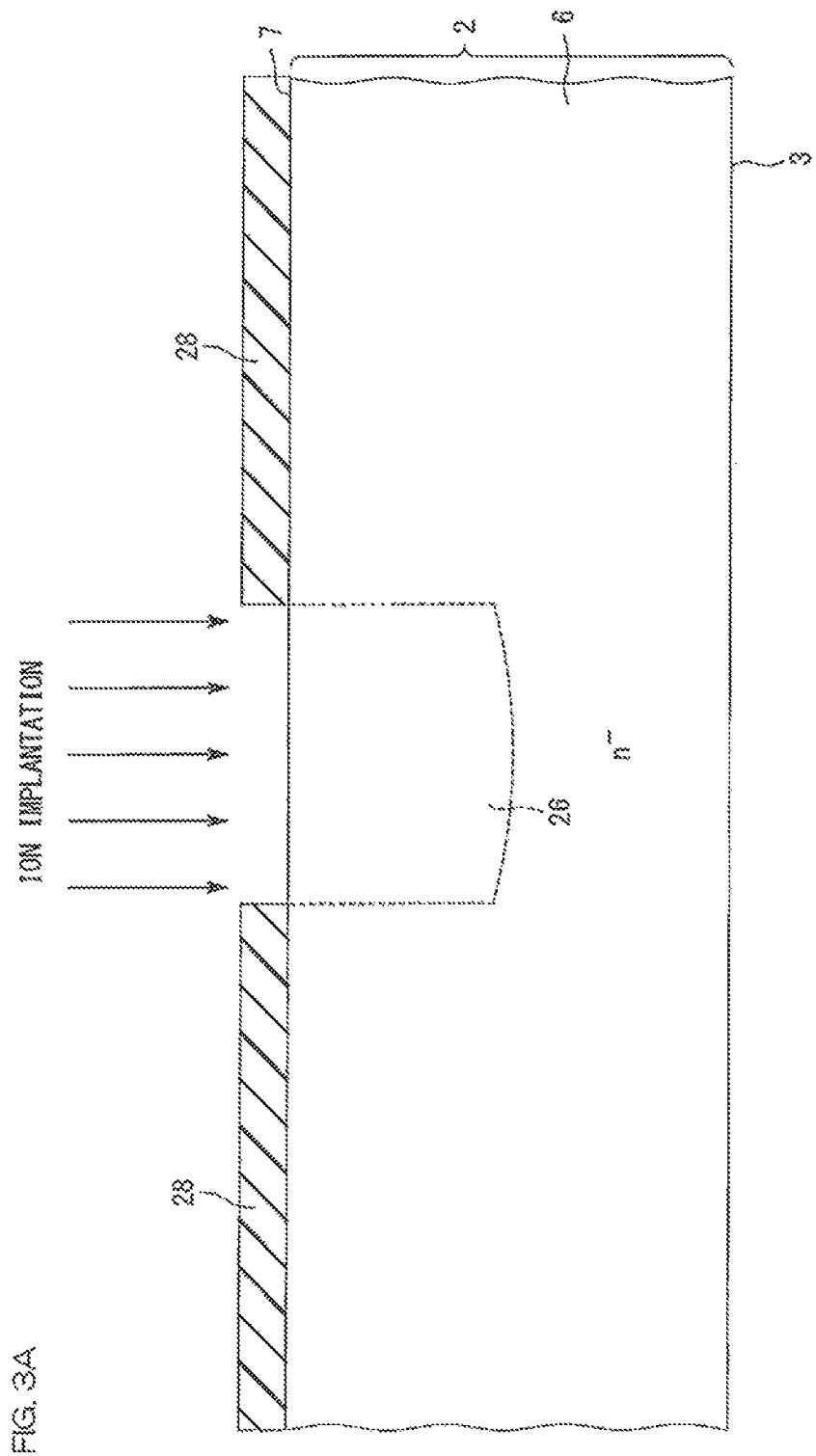

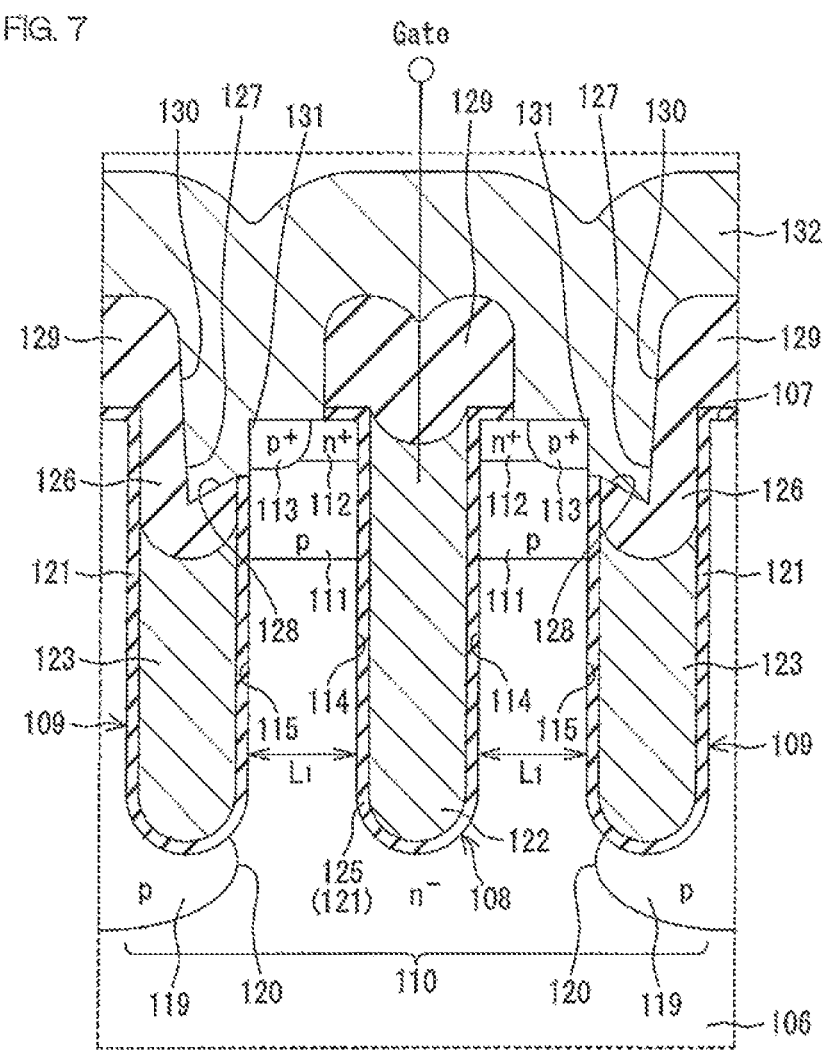

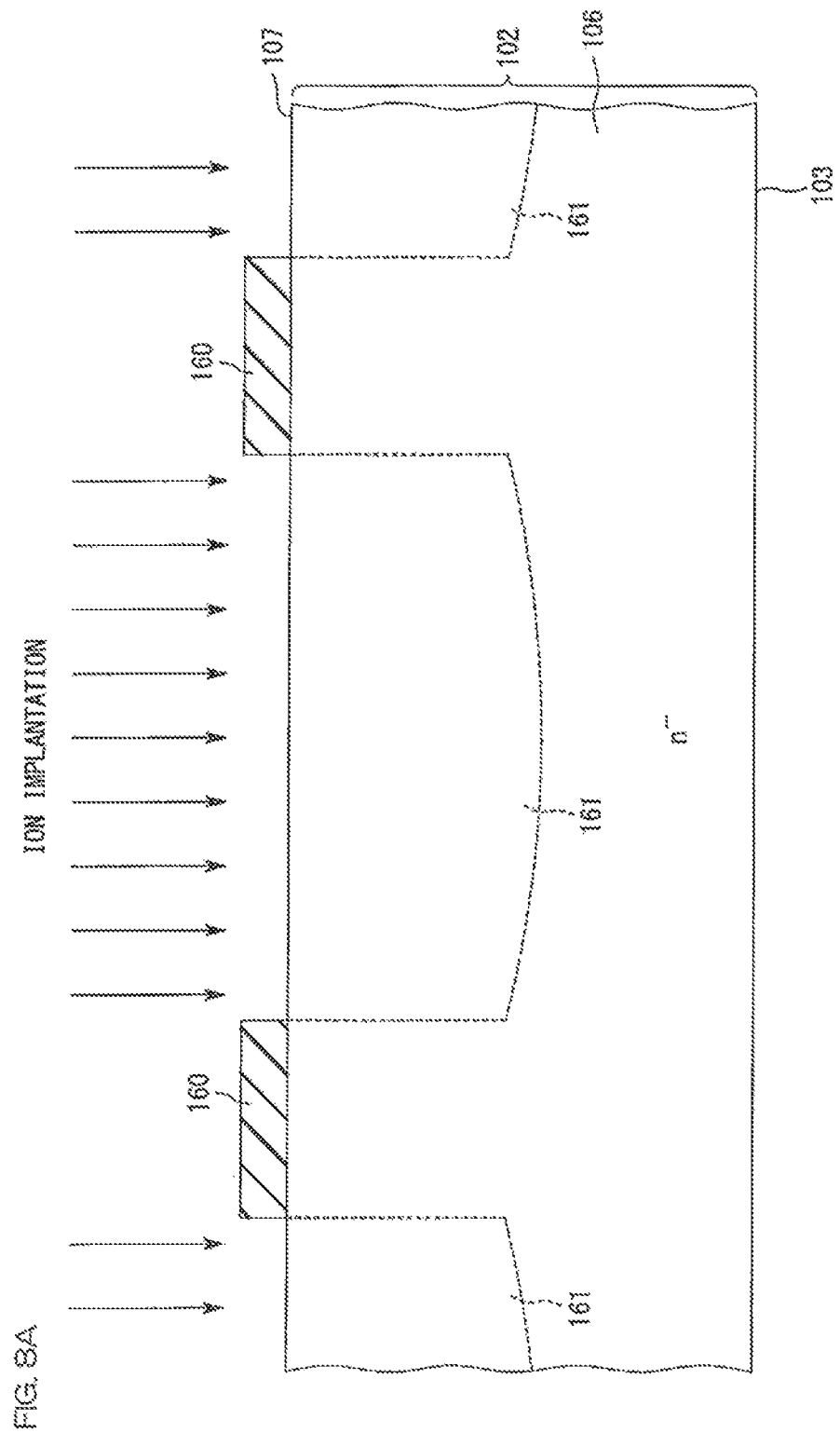

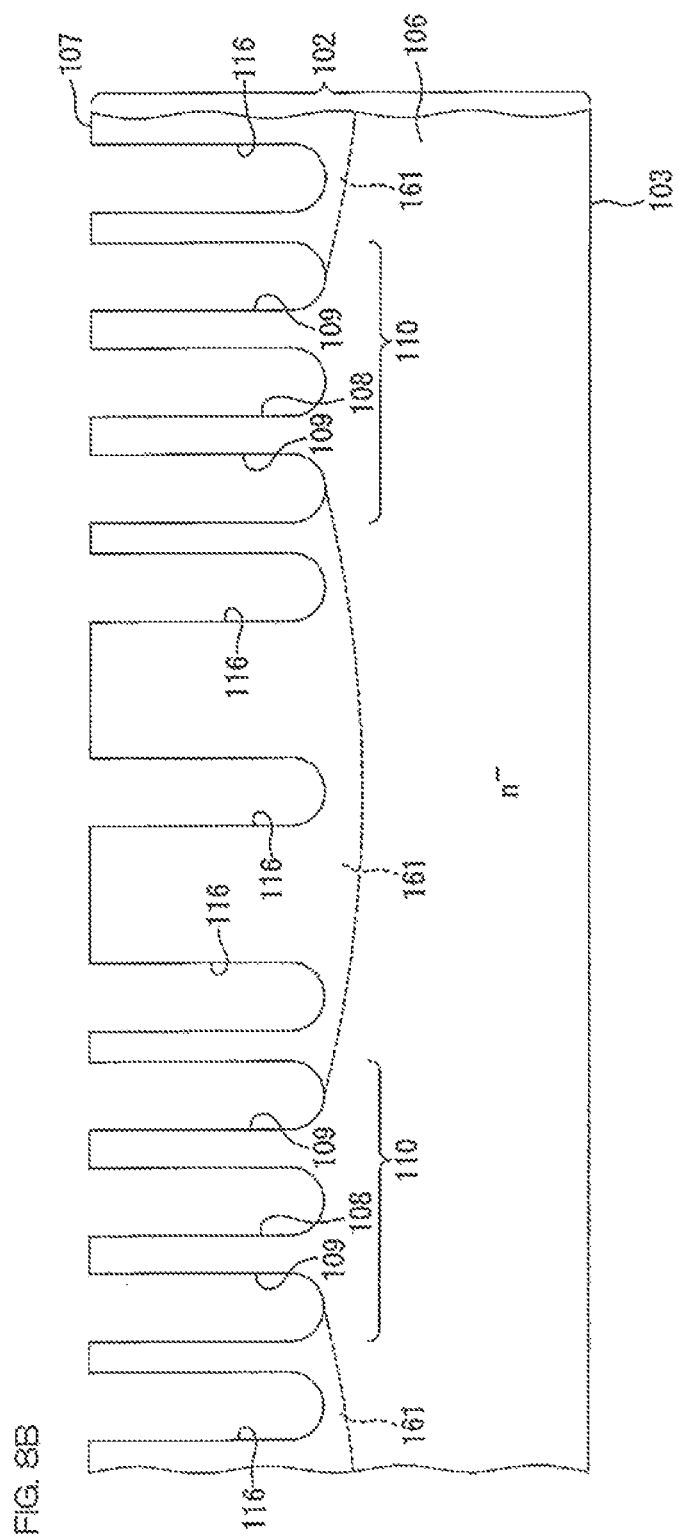

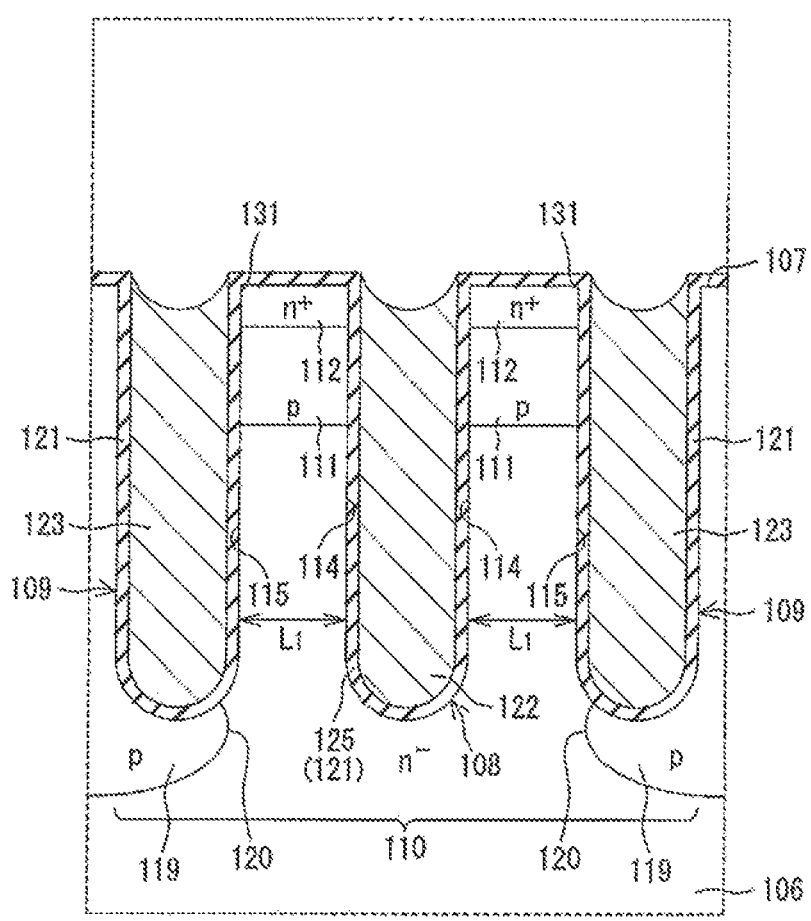

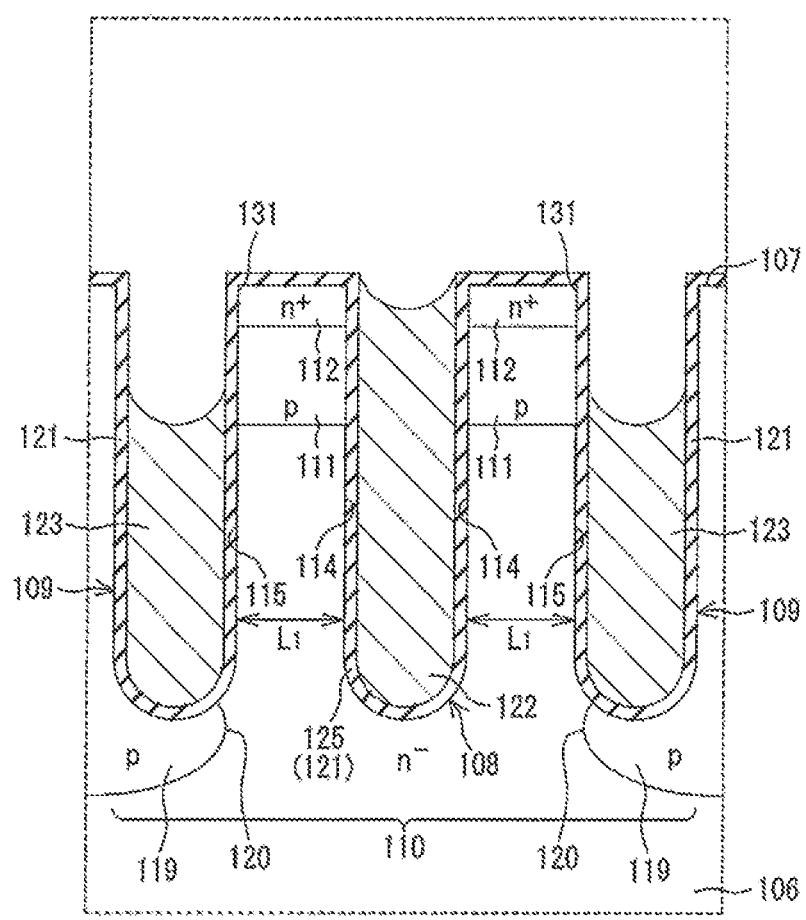

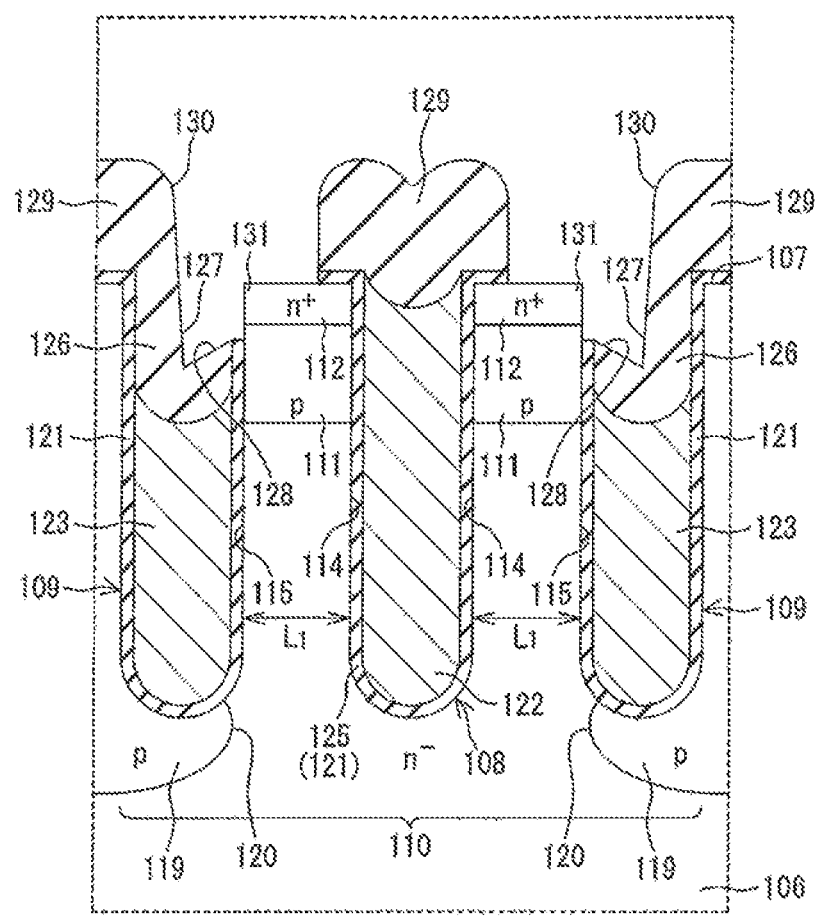

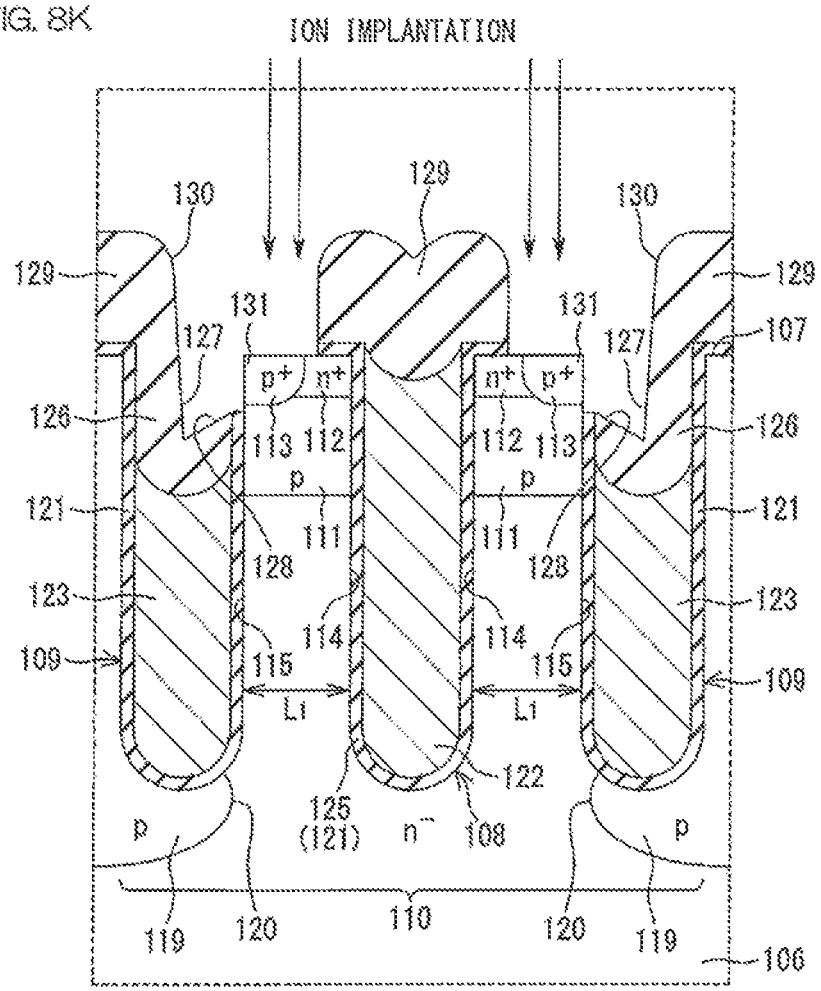

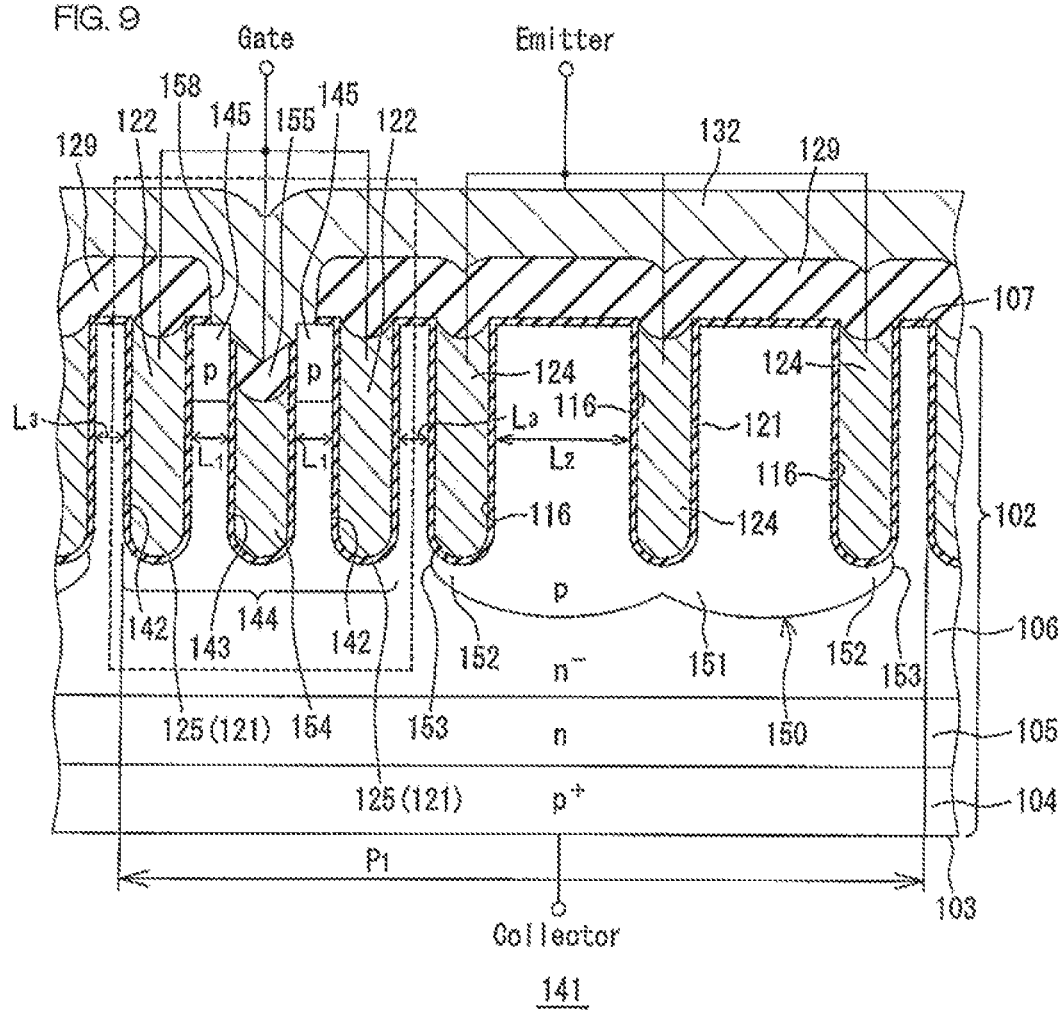

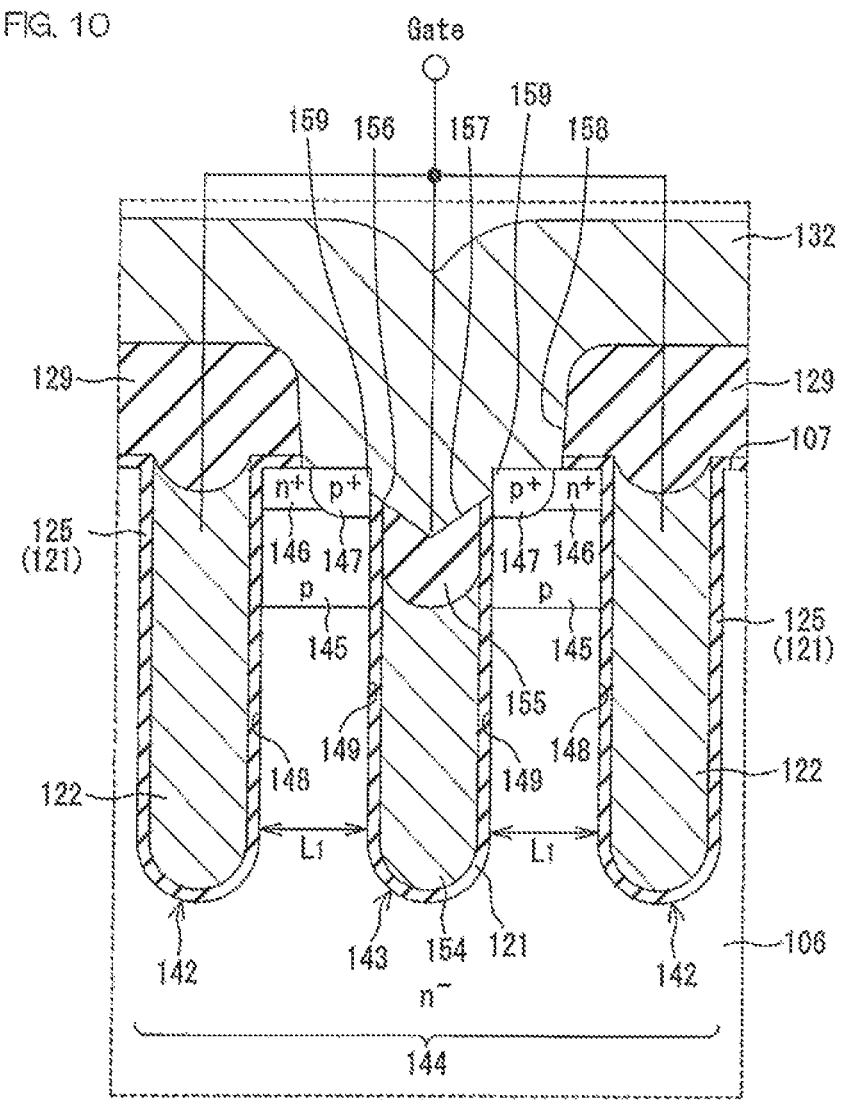

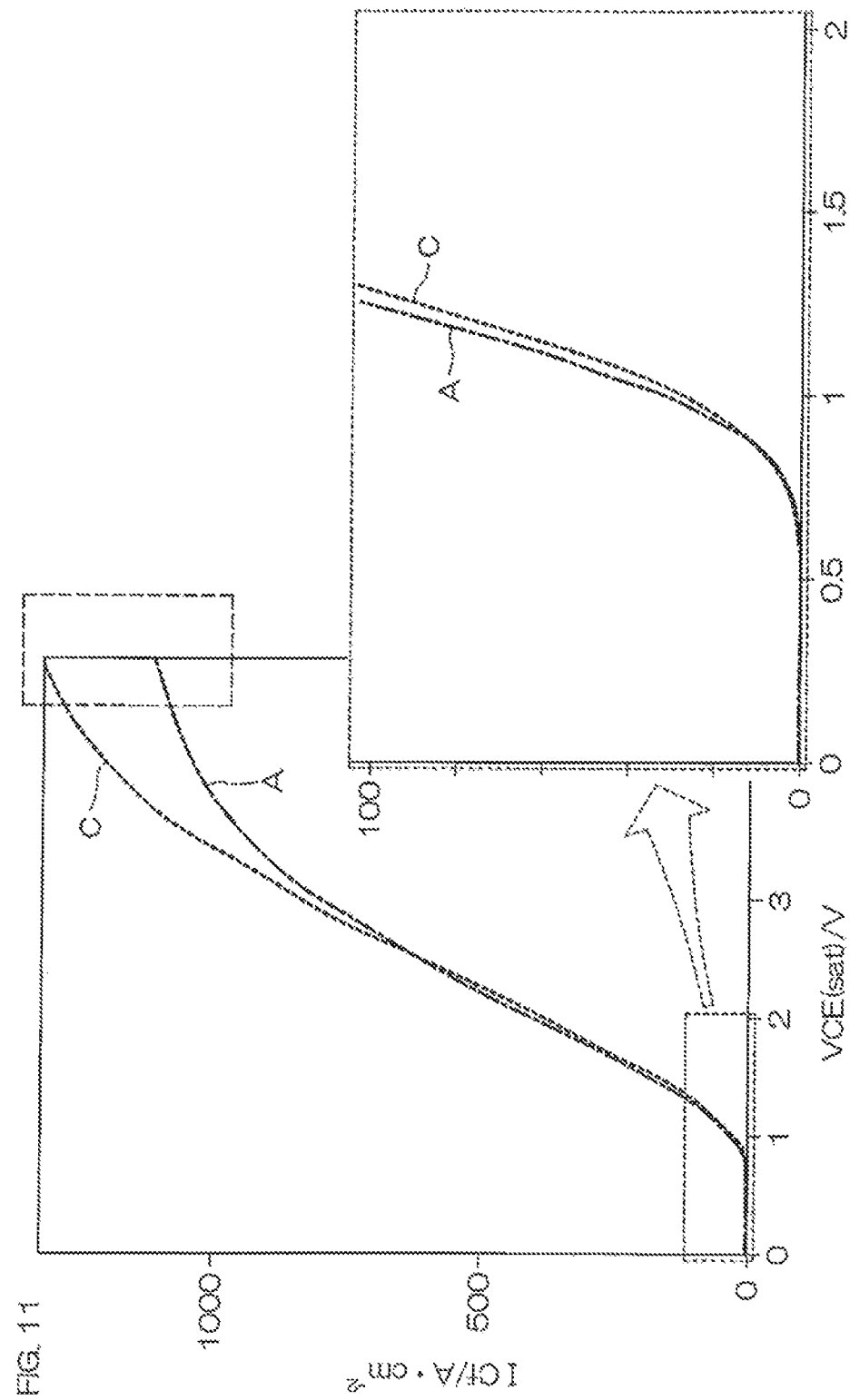

TRENCH-TYPE INSULATED GATE SEMICONDUCTOR DEVICE INCLUDING AN EMITTER TRENCH AND AN OVERLAPPED FLOATING REGION

This is a Continuation of U.S. application Ser. No. 15/378,016, filed on Dec. 13, 2016, and allowed on Apr. 30, 2018, which was a Continuation of U.S. application Ser. No. 13/969,697, filed on Aug. 19, 2013 (issued on Jan. 10, 2017, as a U.S. Pat. No. 9,543,421), which claimed the benefit of priority of Japanese application No. 2012-182170, filed on Aug. 21, 2012, Japanese application No. 2012-182169, filed on Aug. 21, 2012, and Japanese application No. 2013-167478, filed on Aug. 12, 2013. The disclosures of these prior U.S. and foreign applications are incorporated herein by reference.

TECHNICAL FIELD

The present invention relates to a semiconductor device including IGBTs (Insulated Gate Bipolar Transistors).

BACKGROUND ART

Conventionally, a trench-type IGBT having a high saturation voltage $V_{CE}$(sat) and short-circuit capacity between the collector and emitter has a p-type floating layer. The p-type floating layer is generally formed by the same step as that for a p-type base layer. The p-type floating layer therefore has the same depth as the p-type base layer.

SUMMARY OF INVENTION

However, in the conventional structure, there is a problem that withstand voltage is maintained when the p-type floating layer is deeply diffused for maintaining the withstand voltage of a device, but the p-type base layer is accordingly thickened to raise ON-voltage. On the other hand, if the p-type base layer is thinned for a reduction in ON-voltage, it conversely becomes difficult to maintain a sufficient withstand voltage.

It is an object of the present invention to provide a semiconductor device including IGBTs capable of increasing withstand voltage while suppressing a rise in ON-voltage.

BRIEF DESCRIPTION OF DRAWINGS

FIG. 3A is a view for explaining a manufacturing step of the semiconductor device of FIG. 1.

FIG. 3I is a view showing a following step of FIG. 3F.

FIG. 5A and FIG. 5B are views for explaining an internal structure of the semiconductor device of FIG. 4, wherein FIG. 5A shows a perspective view, and FIG. 5B shows a plan view.

FIG. 7 is an enlarged view of a part enclosed by a broken line of FIG. 6.

FIG. 9 is a schematic sectional view of a semiconductor device according to a fourth embodiment of the present invention.

FIG. 10 is an enlarged view of a part enclosed by a broken line of FIG. 9.

FIG. 11 is a graph showing $V_{CE}$–$I_{Cf}$ characteristics of devices.

DESCRIPTION OF EMBODIMENTS

Figure 1:
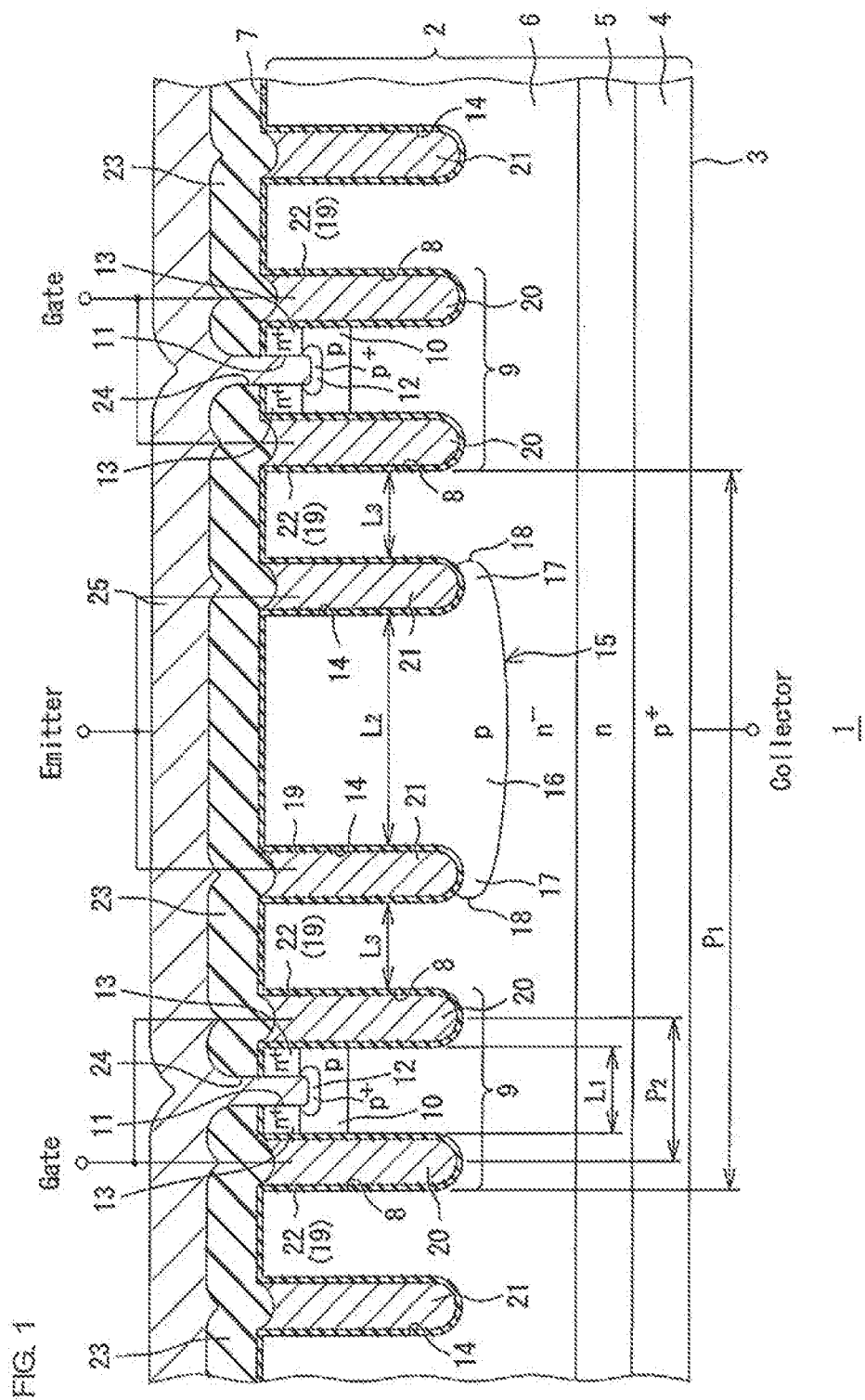
FIG. 1 is a schematic sectional view of a semiconductor device according to a first embodiment of the present invention.

A semiconductor device of the present invention includes a semiconductor layer, a plurality of gate trenches formed in the semiconductor layer, a gate electrode filled via a gate insulating film in the plurality of gate trenches, an $n^+$-type emitter region, a p-type base region, and an $n^-$-type drift region disposed, lateral to each gate trench, in order in a depth direction of the gate trench from a front surface side of the semiconductor layer, a $p^+$-type collector region disposed on a back surface side of the semiconductor layer with respect to the $n^-$-type drift region, a plurality of emitter trenches formed between the plurality of gate trenches adjacent to each other, a buried electrode filled via an insulating film in the plurality of emitter trenches, electrically connected with the $n^+$-type emitter region, and a p-type floating region formed between the plurality of emitter trenches, and the p-type floating region is formed deeper than the p-type base region, and includes an overlap portion that goes around to a lower side of an emitter trench closest to the gate trench out of the plurality of emitter trenches and has an end portion positioned on a side closer to the gate trench with respect to a center in a width direction of the emitter trench.

According to this arrangement, the p-type floating region (overlap portion) is formed up to a bottom portion of the emitter trench filled with the buried electrode (hereinafter, referred to as an "emitter junction trench"). A collector-emitter voltage to be loaded on the emitter junction trench at switching-off operation can thereby be relieved. Therefore, a device breakdown can be prevented against a steep voltage change (dv/dt).

Also, because withstand voltage can be increased by the p-type floating region that is deeper than the p-type base region, while the p-type base region may be shallow, the channel length can also be reduced to suppress a rise in ON-voltage by appropriately designing the depth of the p-type base region.

The p-type floating region may have a bottom portion that bulges to a back surface side of the semiconductor layer with respect to a bottom portion of the emitter trench.

Also, the emitter trench is preferably formed at the same depth as that of the gate trench. In this case, the emitter trench is formed by the same step as that for the gate trench, the manufacturing process can be simplified.

Also, the gate trenches may be disposed one pair each in a transverse direction along the front surface of the semiconductor layer, and the pair of gate trenches may be opposed in the transverse direction via the p-type base region that is common thereto. In this case, one of the pair of gate trenches may be disposed at an interval of 2 μm to 7 μm with respect to the other.

The n$^+$-type emitter region may have an n-type dopant concentration of $1\times10^{19}$ cm$^{-3}$ to $5\times10^{20}$ cm$^{-3}$. The p-type base region may have a p-type dopant concentration of $1\times10^{16}$ cm$^{-3}$ to $1\times10^{18}$ cm$^{-3}$. The n$^-$-type drift region may have an n-type dopant concentration of $1\times10^{13}$ cm$^{-3}$ to $5\times10^{14}$ cm$^{-3}$. The p$^+$-type collector region may have a p-type dopant concentration of $1\times10^{15}$ cm$^{-3}$ to $2\times10^{19}$ cm$^{-3}$.

Also, the n$^+$-type emitter region preferably selectively has a pullout portion pulled out in a transverse direction along the front surface of the semiconductor layer from a side surface of the gate trench.

Also, the semiconductor device preferably includes a dummy trench formed spaced at a predetermined interval lateral to the gate trench so that the n$^+$-type emitter region, the p-type base region, and the n$^-$-type drift region are formed between the dummy trench and the gate trench, a buried insulating film being a buried insulating film filled in the dummy trench and having an upper surface on a bottom side of the dummy trench with respect to the front surface of the semiconductor layer, for selectively exposing as a contact region a part of the p-type base region at a part from the front surface to the upper surface in a side surface of the dummy trench, and a contact electrode filled in a region over the buried insulating film of the dummy trench, connected to the contact region on the side surface of the dummy trench.

According to this arrangement, because the side surface of the dummy trench can be effectively used as the contact region, a junction area of the contact electrode with respect to the p-type base region can be sufficiently secured. Because a plane area of the p-type base region can thereby be sacrificed, the interval between the gate trench and the dummy trench can be miniaturized to form a p-type base region more minute than the conventional p-type base region. Furthermore, because the dummy trench can be formed using the same mask as that for the gate trench, misalignment with respect to the gate trench does not occur. Moreover, alignment of the contact electrode, for which alignment with an area including a plane area of the dummy trench suffices, can thus be easily attained.

Also, as a result of miniaturization of the trench structure, a trade-off relationship between the short-circuit capacity and ON-voltage of the device can be improved, so that a charge enhancement effect can be increased. $V_{CE}$(sat) in a low-current range can hence be improved.

The semiconductor device may further include a first buried electrode filled via an insulating film in a region under the buried insulating film of the dummy trench.

Also, the semiconductor device may have a trench unit including a pair of the dummy trenches and a gate trench sandwiched between the pair of dummy trenches.

Also, the dummy trench preferably serves also as the emitter trench as a result of the first buried electrode being electrically connected with the n$^+$-type emitter region.

Also, the semiconductor device may have a trench unit including a pair of the gate trenches and a dummy trench sandwiched between the pair of gate trenches. In this case, the first buried electrode is preferably electrically connected with the gate electrode.

Also, the buried insulating film preferably has a thickness of 0.5 μm or more.

Hereinafter, embodiments of the present invention will be described in detail with reference to the accompanying drawings.

Figure 2:
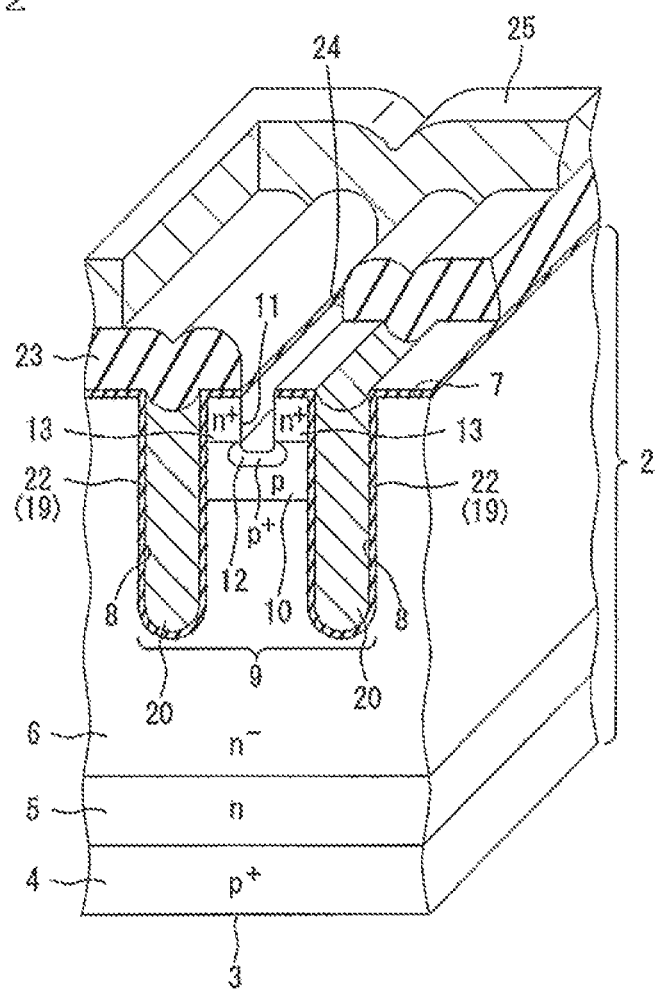
FIG. 2 is a perspective view for explaining an internal structure of the semiconductor device of FIG. 1.

FIG. 1 is a schematic sectional view of a semiconductor device 1 according to a first embodiment of the present invention. FIG. 2 is a perspective view for explaining an internal structure of the semiconductor device 1 of FIG. 1.

The semiconductor device 1 is a device including IGBTs, and includes a semiconductor substrate 2 as an example of a semiconductor layer of the present invention. The semiconductor substrate 2 may be, for example, an n$^-$-type silicon substrate having a thickness of 50 μm to 200 μm.

The semiconductor substrate 2 has a structure in which a p$^+$-type collector region 4, an n-type buffer region 5, and an n$^-$-type drift region 6 are stacked in order from the side of its back surface 3. The p$^+$-type collector region 4 is exposed over the entire back surface 3 of the semiconductor substrate 2, and the n$^-$-type drift region 6 is selectively exposed on a part of a front surface 7 of the semiconductor substrate 2.

As a p-type dopant of the p$^+$-type collector region 4, for example, B (boron), Al (aluminum), and others can be used (the same applies to the following). On the other hand, as an n-type dopant of the n-type buffer region 5 and the n$^-$-type drift region 6, for example, N (nitrogen), P (phosphorus), As (arsenic), and others can be used (the same applies to the following).

Also, the dopant concentration of the p$^+$-type collector region 4 is, for example, $1\times10^{15}$ cm$^{-3}$ to $2\times10^{19}$ cm$^{-3}$. On the other hand, the dopant concentration of the n-type buffer region 5 is, for example, $1\times10^{15}$ cm$^{-3}$ to $5\times10^{17}$ cm$^{-3}$, and the dopant concentration of the n$^-$-type drift region 6 is $1\times10^{13}$ cm$^{-3}$ to $5\times10^{14}$ cm$^{-3}$.

On the side of the front surface 7 of the semiconductor substrate 2, a plurality of gate trenches 8 are formed. In the present embodiment, the plurality of gate trenches 8 are formed in, for example, a stripe form, and disposed as trench units 9 of one pair each in the transverse direction along the front surface 7 of the semiconductor substrate 2. The pitch $P_1$ of mutually adjacent trench units 9 is, for example, 4 μm to 20 μm. Also, in a pair of gate trenches 8, the pitch $P_2$ of one gate trench 8 and the other gate trench 8 (distance of center points of the gate trenches 8) is, for example, 2 μm to 7 μm, and the interval $L_1$ (distance between side surfaces of the gate trenches 8) is, for example, 1μm to 6 μm.

Between a pair of gate trenches 8, a p-type base region 10 is formed. The p-type base region 10 is shared by one gate trench 8 and the other gate trench 8. Also, in the present embodiment, an interface between the p-type base region 10 and the n$^-$-type drift region 6 is set in a central portion or upper portion of the gate trenches 8, so that the p-type base region 10 is formed by diffusion at a relatively shallow position of the semiconductor substrate 2.

In the p-type base region 10, a contact trench 11 dug down from the front surface 7 of the semiconductor substrate 2 is formed. The contact trench 11 is formed with a fixed width along the longitudinal direction of the gate trench 8. On a bottom surface of the contact trench 11, a p$^+$-type base contact region 12 is formed.

Also, in a front surface portion of the p-type base region 10 between the contact trench 11 and one and the other gate trenches 8, an n$^+$-type emitter region 13 is formed. The n$^+$-type emitter regions 13 are formed one each on both side surfaces of the contact trench 11, and are respectively exposed on side surfaces of the contact trench 11.

Also, the dopant concentration of the p-type base region 10 is, for example, $1 \times 10^{16}$ cm$^{-3}$ to $1 \times 10^{18}$ cm$^{-3}$. The dopant concentration of the p$^+$-type base contact region 12 is, for example, $5 \times 10^{18}$ cm$^{-3}$ to $1 \times 10^{20}$ cm$^{-3}$. The dopant concentration of the n$^+$-type emitter region 13 is $1 \times 10^{19}$ cm$^{-3}$ to $5 \times 10^{20}$ cm$^{-3}$.

Also, between a pair of gate trenches 8 on the side of the front surface 7 of the semiconductor substrate 2, a plurality of (in FIG. 1, two) emitter trenches 14 are formed. In the present embodiment, the plurality of emitter trenches 14 are formed in, for example, a stripe form (parallel to the gate trenches 8), and disposed spaced at mutually equal intervals in the transverse direction along the front surface 7 of the semiconductor substrate 2. The interval $L_2$ of mutually adjacent emitter trenches 14 (distance between side surfaces of the emitter trenches 14) is, for example, 3 μm or less, and preferably, 0.8 μm to 3 μm. Also, the plurality of emitter trenches 14 are formed at the same depth as that of the gate trenches 8. Because the emitter trenches 14 and the gate trenches 8 can thereby be formed by the same step, the manufacturing process can be simplified.

Out of the plurality of emitter trenches 14, a trench that is adjacent to the gate trench 8 (trench that is opposed to the gate trench 8 via no trench therewith) is disposed at an interval $L_3$ (distance between the side surface of the emitter trench 14 and the side surface of the gate trench 8) of 2 μm or less via the n$^-$-type drift region 6 with the gate trench 8. That is, between said emitter trench 14 and the gate trench 8, the n$^-$-type drift region 6 is interposed across the entire area in the depth direction.

Also, in each section between the plurality of emitter trenches 14, a p-type floating region 15 is formed. The p-type floating region 15 is a semiconductor region where a floating state is electrically maintained, and is separated from the gate trench 8 by the emitter trench 14 that is adjacent to the gate trench 8. The p-type floating region 15 is, in the present embodiment, formed deeper than the p-type base region 10.

The p-type floating region 15 has a bottom portion 16 that bulges to the side of the back surface 3 of the semiconductor substrate 2 with respect to a bottom portion of the emitter trenches 14 and an overlap portion 17 that goes around to the lower side of the emitter trench 14 adjacent to the gate trench 8. The overlap portion 17 has an end portion 18 positioned on a side closer to the gate trench 8 with respect to the center in the width direction of said emitter trench 14. The end portion 18 is preferably not projecting to the side of the gate trench 8 with respect to the emitter trench 14.

Also, the dopant concentration of the p-type floating region 15 is, for example, $5 \times 10^{15}$ cm$^{-3}$ to $1 \times 10^{18}$ cm$^{-3}$.

In the gate trenches 8 and the emitter trenches 14, gate electrodes 20 and buried electrodes 21 are filled, respectively, via an insulating film 19 (for example, silicon oxide (SiO$_2$)). The gate electrodes 20 and the buried electrodes 21 are made of, for example, a conductive material such as polysilicon. The insulating film 19 is integrally formed along inner surfaces of the gate trenches 8, the front surface 7 of the semiconductor substrate 2, and inner surfaces of the emitter trenches 14. The part of the insulating film 19 in the gate trench 8 serves as a gate insulating film 22. Also, a plurality of buried electrodes 21 of the emitter trenches 14 are electrically connected to an emitter electrode 25 to be described later.

On the front surface 7 of the semiconductor substrate 2, an interlayer film 23 made of, for example, an insulating material such as boron phosphorus silicate glass (BPSG) or silicon oxide (SiO$_2$) is stacked. In the interlayer film 23, a contact hole 24 is formed to selectively expose the n$^+$-type emitter region 13 and the p$^+$-type base contact region 12 via the contact trench 11.

On the interlayer film 23, an emitter electrode 25 is stacked. The emitter electrode 25 enters the contact trench 11, and is connected to the n$^+$-type emitter region 13 on the side surface of the contact trench 11. Also, on the bottom surface of the contact trench 11, the emitter electrode 25 is connected to the p-type base region 10 via the p$^+$-type base contact region 12.

Next, a manufacturing method of the semiconductor device 1 will be explained. FIG. 3A to FIG. 3I are views for explaining the manufacturing process of the semiconductor device 1 of FIG. 1 in the order of steps.

For manufacturing the semiconductor device 1, as shown in FIG. 3A, a mask 28 is formed on the front surface 7 of the n$^-$-type semiconductor substrate 2 (n$^-$-type drift region 6). In the mask 28, there is formed an opening to selectively expose a region that needs to be formed into the p-type floating region 15 in the front surface 7. Then, via the mask 28, a p-type dopant is ion-implanted into the front surface 7 of the semiconductor substrate 2. An ion-implanted region 26 is thereby formed.

Figure 3B:
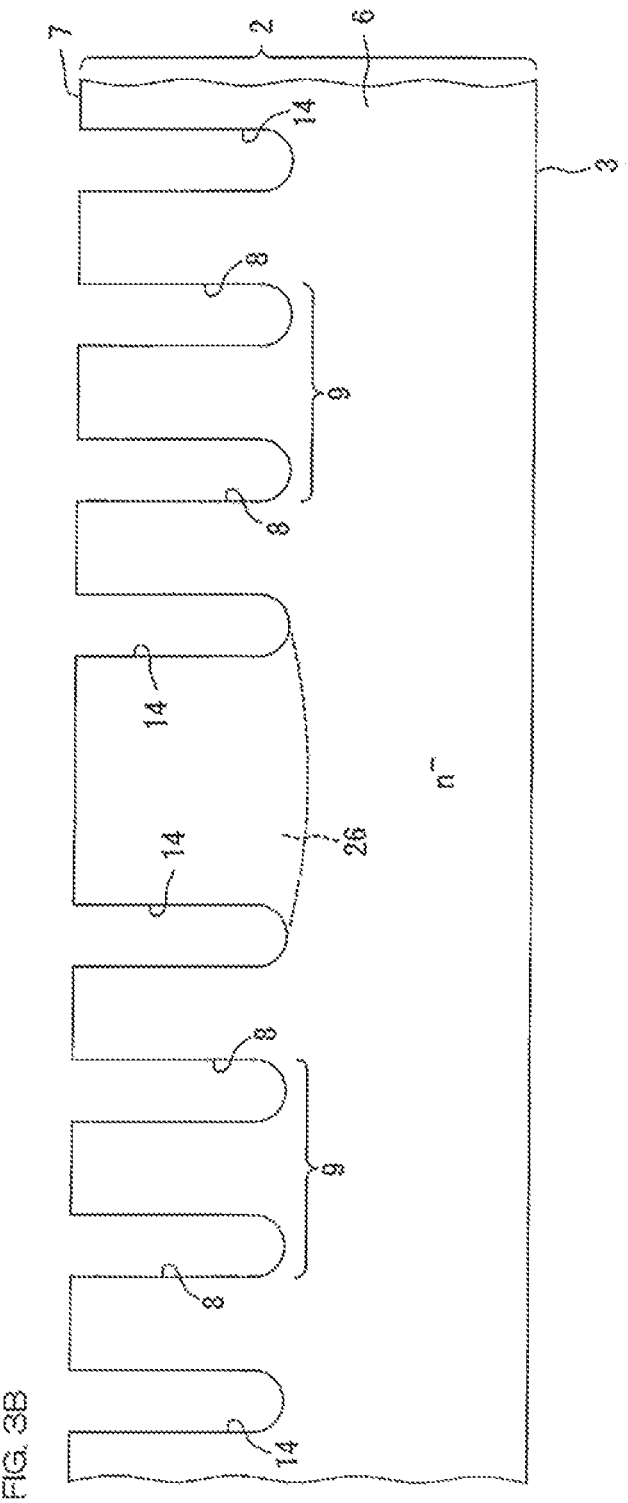
FIG. 3B is a view showing a following step of FIG. 3A.

Next, as shown in FIG. 3B, by the semiconductor substrate 2 being selectively etched, the gate trenches 8 and the emitter trenches 14 are simultaneously formed.

Figure 3C:
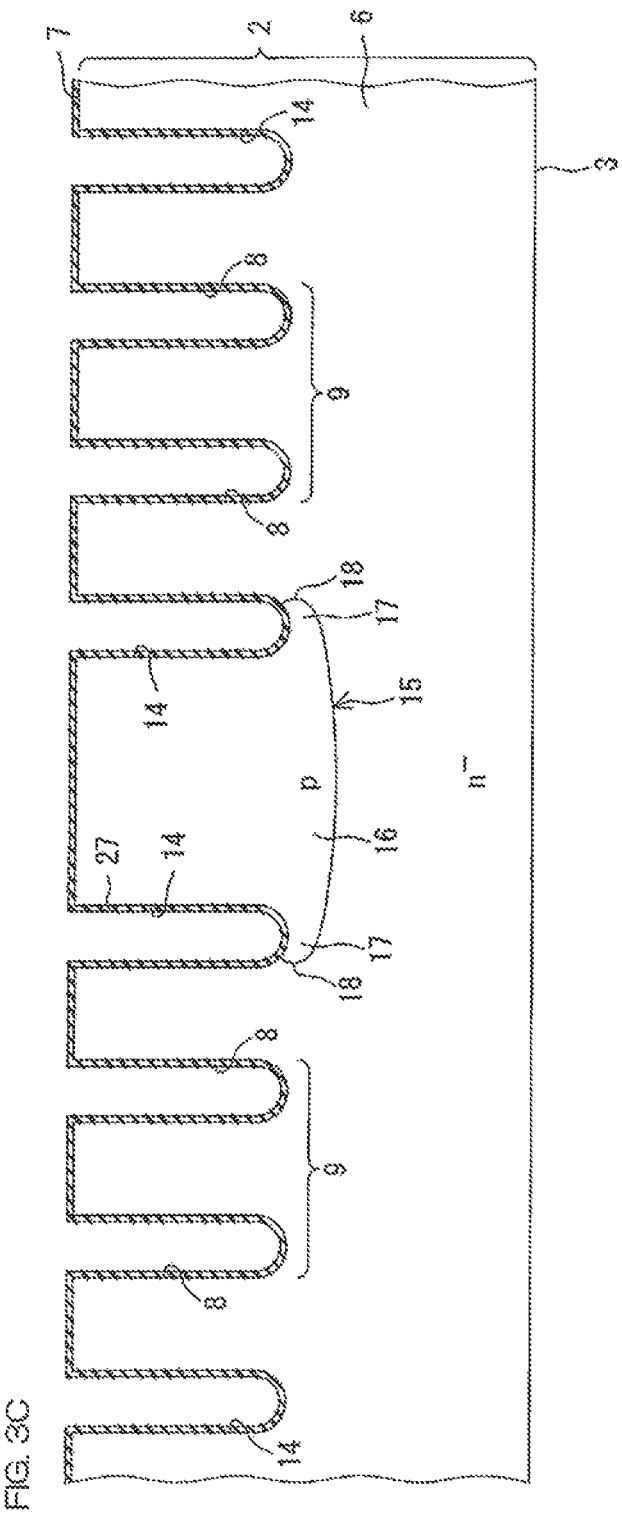
FIG. 3C is a view showing a following step of FIG. 3B.

Next, as shown in FIG. 3C, by the semiconductor substrate 2 being thermally oxidized, a sacrificial oxide film 27 is formed on the entire area of the front surface including the inner surfaces of the gate trenches 8 and the emitter trenches 14. Then, by annealing the semiconductor substrate 2 covered with the sacrificial oxide film 27, the p-type dopant in the ion-implanted region 26 is diffused (driven in). The annealing treatment is performed on a condition that the p-type dopant goes around to the lower side of the emitter trench 14. The p-type floating region 15 is thereby formed. In this case, because the semiconductor substrate 2 is covered with the sacrificial oxide film 27, ion seeping from the front surface of the substrate can be prevented, so that the p-type dopant can be efficiently diffused.

Figure 3D:
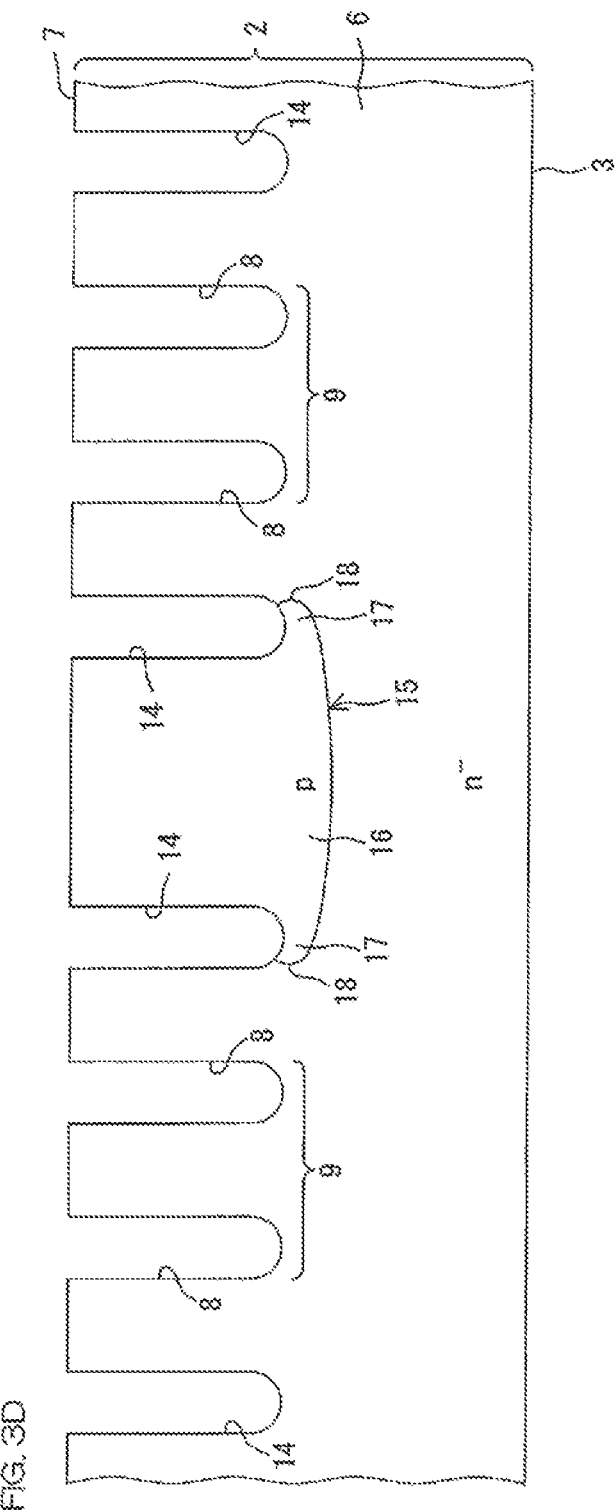
FIG. 3D is a view showing a following step of FIG. 3C.

Next, as shown in FIG. 3D, the sacrificial oxide film 27 is stripped.

Figure 3E:
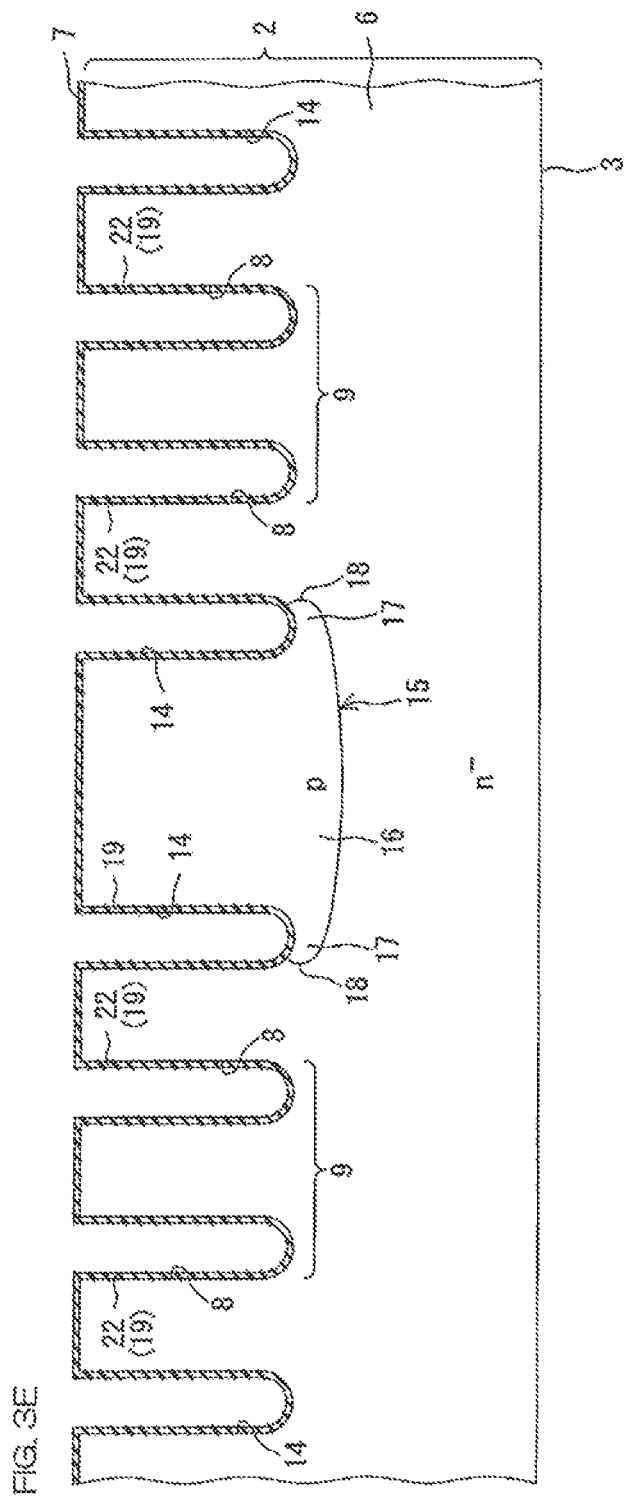
FIG. 3E is a view showing a following step of FIG. 3D.

Next, as shown in FIG. 3E, by the semiconductor substrate 2 being thermally oxidized, the insulating film 19 (gate insulating film 22) is formed on the entire area of the front surface including the inner surfaces of the gate trenches 8 and the emitter trenches 14.

Figure 3F:
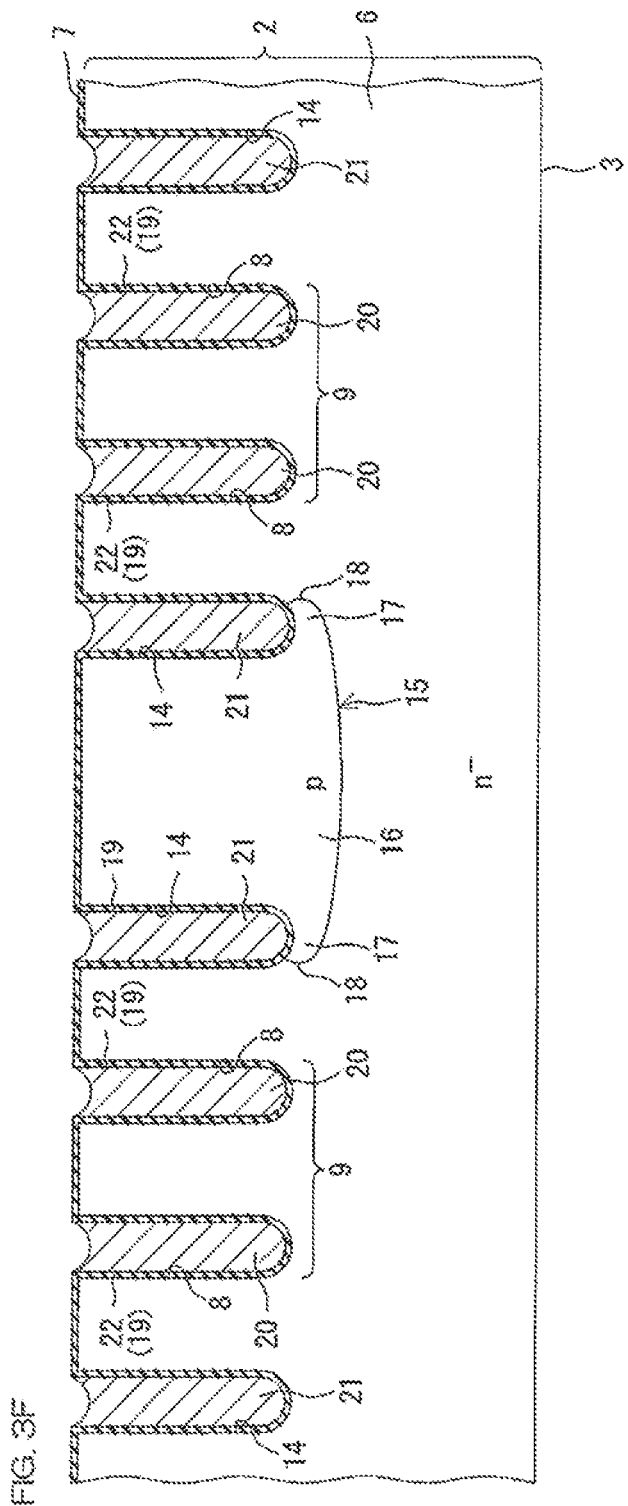
FIG. 3F is a view showing a following step of FIG. 3E.

Next, as shown in FIG. 3F, an electrode material such as polysilicon is filled in the gate trenches 8 and the emitter trenches 14. The gate electrodes 20 and the buried electrodes 21 are thereby simultaneously formed.

Figure 3G:
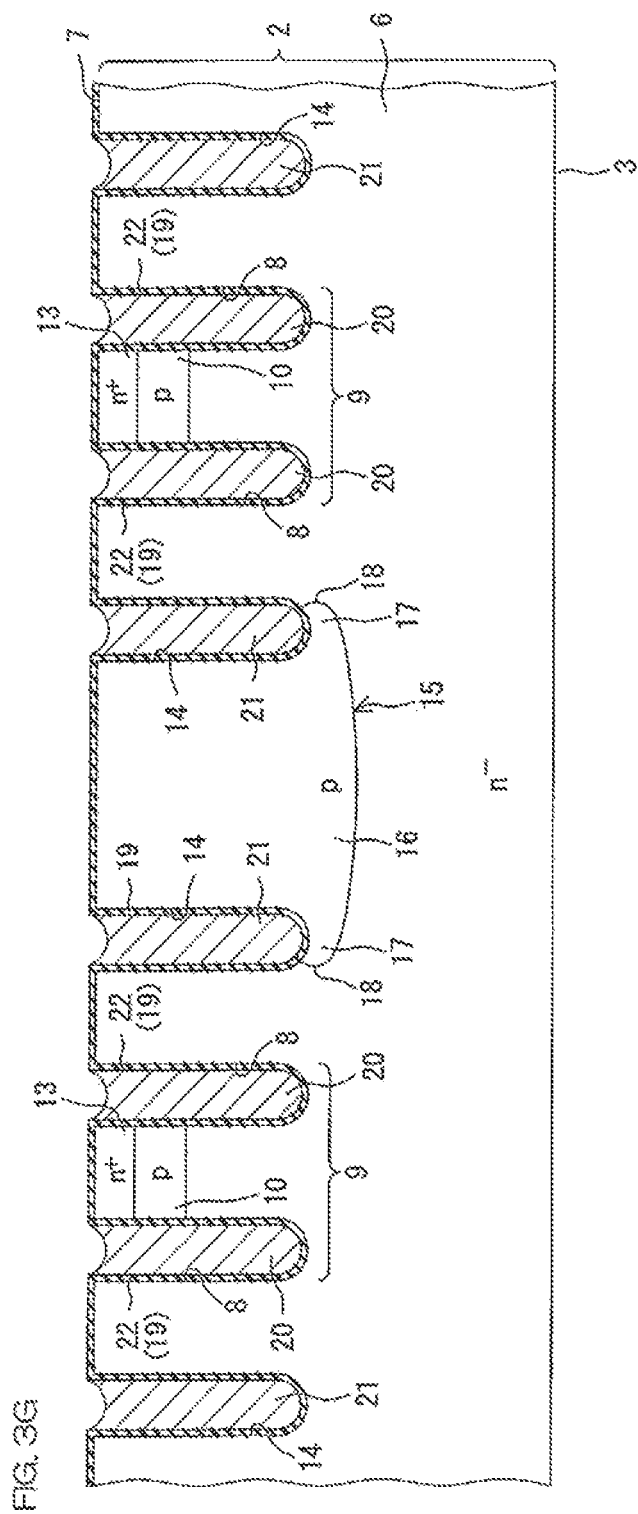
FIG. 3G is a view showing a following step of FIG. 3F.

Next, as shown in FIG. 3G, by n-type and p-type dopants being selectively ion-implanted and diffused into the front surface 7 of the semiconductor substrate 2, the p-type base regions 10 and the n$^+$-type emitter regions 13 are formed in order.

Figure 3H:
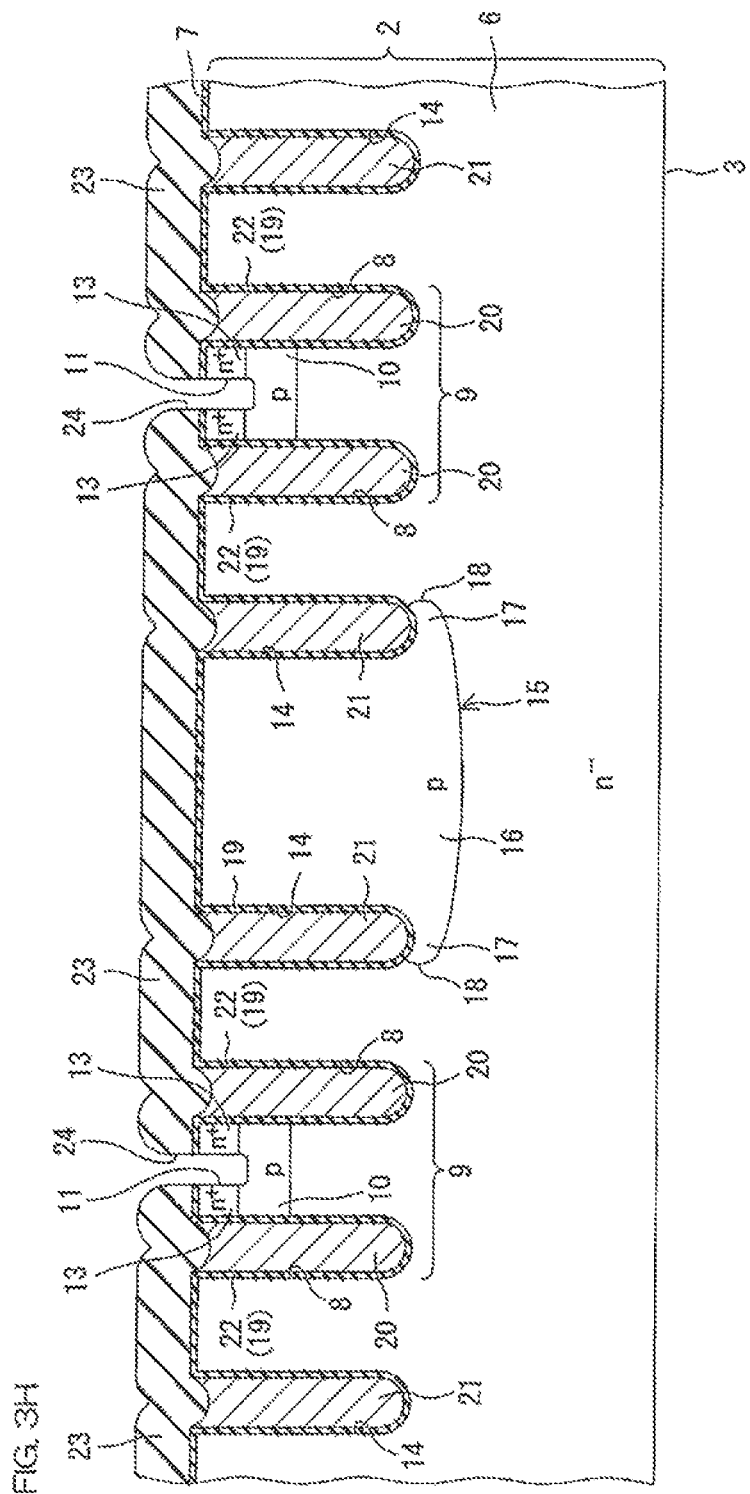
FIG. 3H is a view showing a following step of FIG. 3F.
Figure 31:
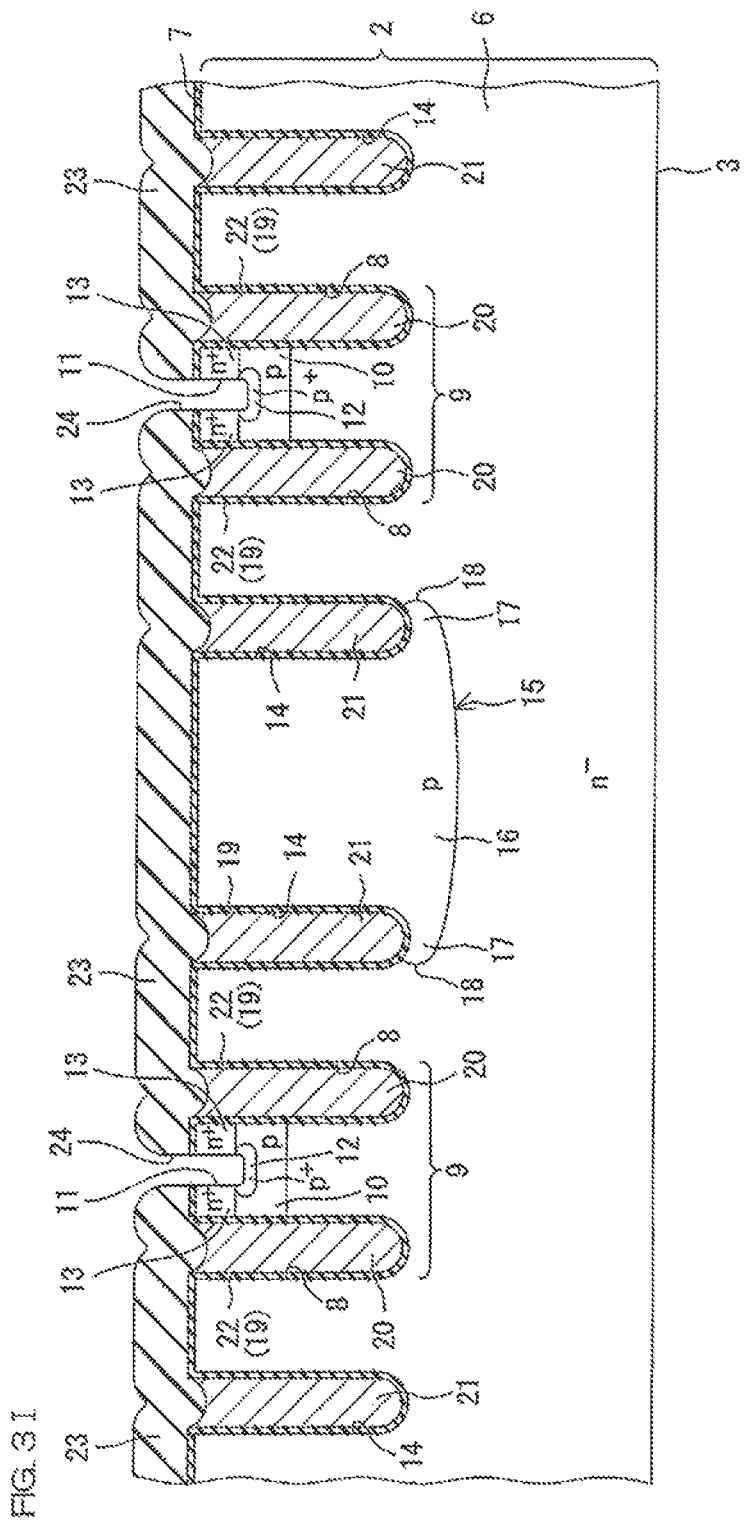

Next, as shown in FIG. 3H, by depositing an insulating material such as boron phosphorus silicate glass (BPSG) or silicon oxide (SiO$_2$) on the front surface 7 of the semiconductor substrate 2, the interlayer film 23 is formed. Next, after the interlayer film 23 is selectively etched to form a contact hole 24, the semiconductor substrate 2 exposed from said contact hole 24 is selectively etched. The contact trench 11 is thereby formed.

Next, as shown in FIG. 3I, by a p-type dopant being selectively ion-implanted and diffused into bottom portions of the contact trenches 11 via the contact holes 24, the p$^+$-type base contact regions 12 are formed.

Thereafter, by n-type and p-type dopants being selectively ion-implanted and diffused into the back surface 3 of the semiconductor substrate 2 after the emitter electrode 24 and the like being formed on the side of the front surface 7 of the semiconductor substrate 2, the n-type buffer region 5 and the p$^+$-type collector region 4 are formed in order.

Through the steps as above, the semiconductor device 1 shown in FIG. 1 is obtained. However, FIG. 3A to FIG. 3I merely represent a part of the manufacturing process of the semiconductor device 1, and said manufacturing process may include steps not shown by FIG. 3A to FIG. 3I.

According to this semiconductor device 1, because the p-type floating region 15 (overlap portion 17) is formed up to a bottom portion of the emitter trench 14 filled with the buried electrode 21 (hereinafter, referred to as an "emitter junction trench"), a collector-emitter voltage to be loaded on the emitter junction trench at switching-off operation can be relieved. Therefore, a device breakdown can be prevented against a steep voltage change (dv/dt).

Also, because withstand voltage can be increased by the p-type floating region 15 that is deeper than the p-type base region 10, while the p-type base region 10 may be shallow, the channel length (length in the depth direction of the gate trench 8) can also be reduced to suppress a rise in ON-voltage by appropriately designing the depth of the p-type base region 10.

Also, the gate trench 8 filled with the gate electrode 20 (hereinafter, referred to as a "gate junction trench") is separated from the p-type floating region 15 by the emitter junction trench. The p-type floating region 15 and the gate junction trench can thereby be prevented from joining. A stray capacitance between the gate junction trench and the p-type floating region 15 can therefore be eliminated.

On the other hand, the n$^-$-type drift region 6 which the gate junction trench joins across the entire area in the depth direction is to be grounded together with the p$^+$-type collector region 4. Therefore, at switching operation, a capacitance change between the gate junction trench and the n$^-$-type drift region 6 is stabilized, so that noise does not easily occur. As a result thereof, generation of noise and switching loss at switching operation can be reduced.

Also, because the interval $L_3$ between the emitter junction trench and the gate junction trench is 2 μm or less, withstand voltage can also be satisfactorily maintained.

Further, because the side surface of the contact trench 11 can be effectively used as a region for contact with the n$^+$-type emitter region 13, a junction area of the emitter electrode 25 with respect to the n$^+$-type emitter region 13 can be sufficiently secured. Because a plane area of the n$^+$-type emitter region 13 can thereby be sacrificed, the interval $L_1$ between one and the other gate trenches 8 of a pair of gate trenches 8 can be miniaturized to form a p-type base region 10 more minute than the conventional p-type base region. As a result of miniaturization of the gate trench 8, a trade-off relationship between the short-circuit capacity and ON-voltage of the device can be improved, so that a charge enhancement effect can be increased. $V_{CE}$(sat) in a low-current range can hence be improved.

Figure 4:
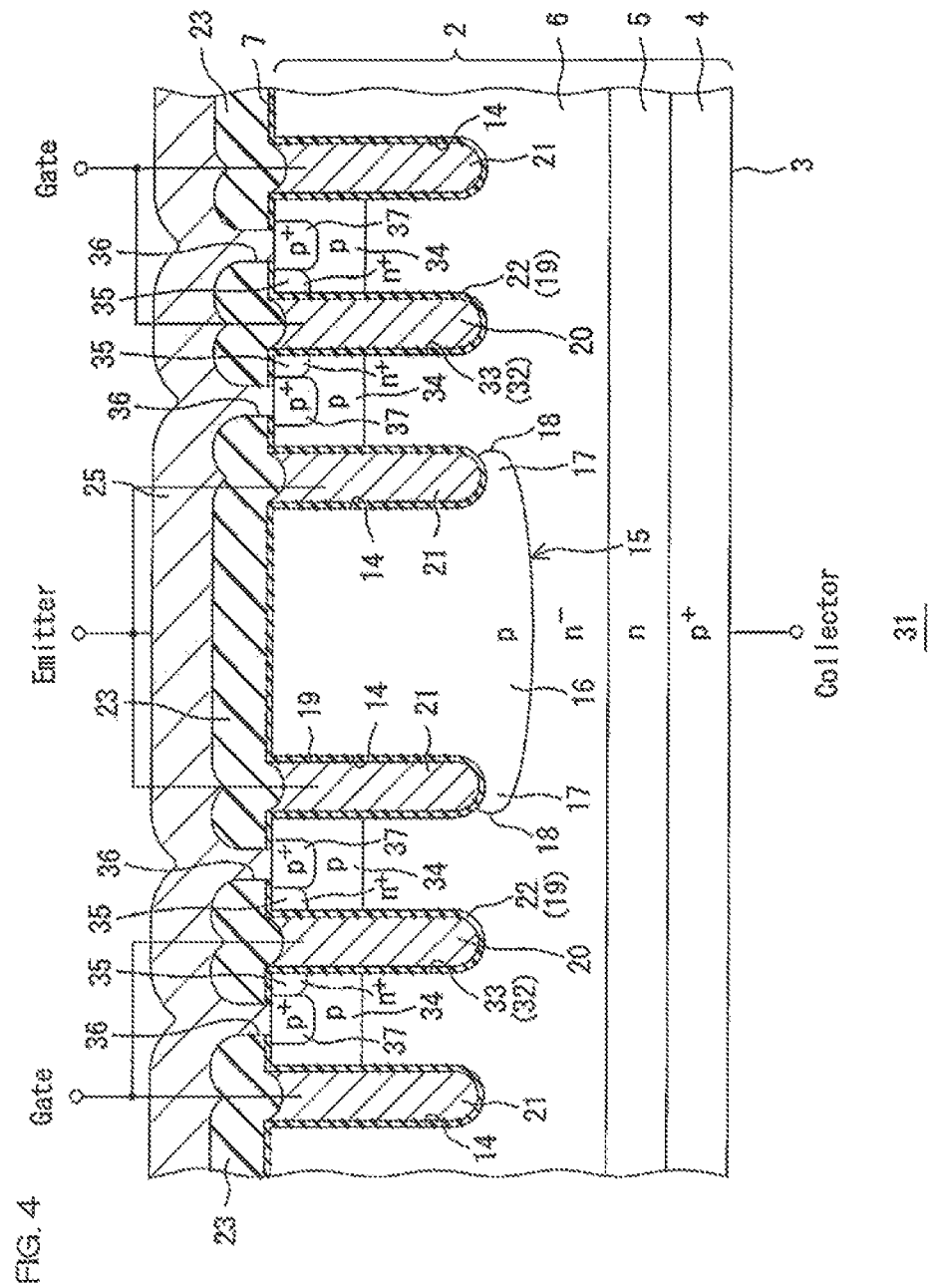
FIG. 4 is a schematic sectional view of a semiconductor device according to a second embodiment of the present invention.
Figure 5A:
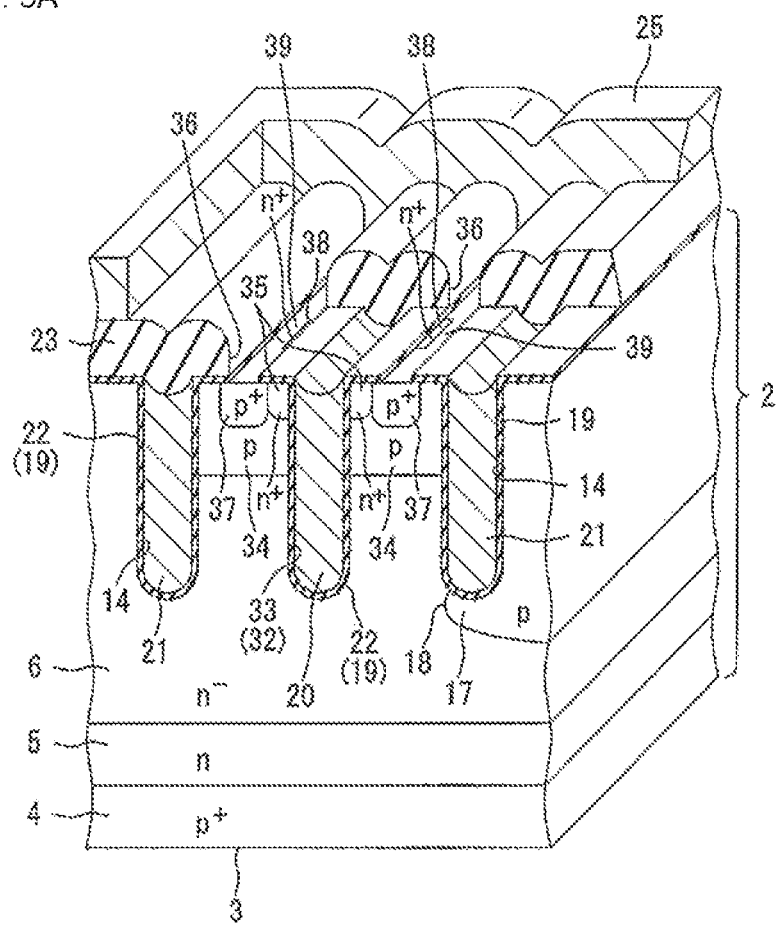
Figure 5B:
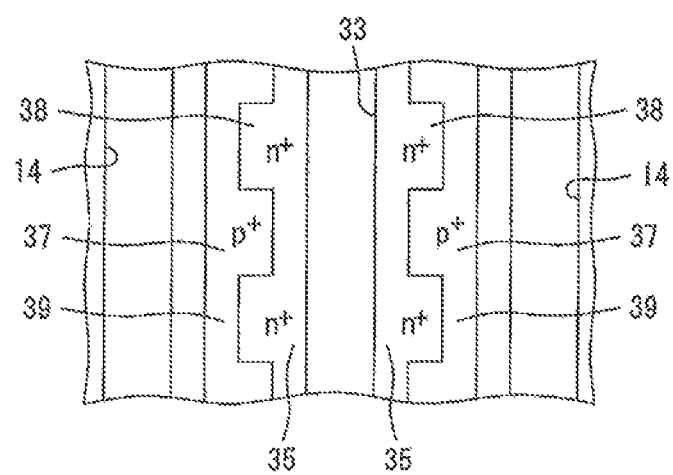

FIG. 4 is a schematic sectional view of a semiconductor device 31 according to a second embodiment of the present invention. FIG. 5A and FIG. 5B are views for explaining an internal structure of the semiconductor device 31 of FIG. 4, wherein FIG. 5A shows a perspective view, and FIG. 5B shows a plan view. In FIG. 4 and FIG. 5A and FIG. 5B, parts corresponding to the respective portions shown in FIG. 1 described above will be denoted by the same reference signs.

In the foregoing first embodiment, the gate trenches 8 are formed as trench units 9 of one pair each, and a common p-type base region 10 is formed between one and the other gate trenches 8. In contrast, the semiconductor device 31 of the second embodiment includes a plurality of gate trenches 33 formed as trench units 32 of one each in the transverse direction along the front surface 7 of the semiconductor substrate 2, p-type base regions 34 formed on both sides of each gate trench 33 (regions between the same and the emitter trenches 14), and n$^+$-type emitter regions 35 formed in front surface portions of the respective p-type base regions 34. The n$^+$-type emitter regions 35 are formed one each along both side surfaces of the gate trench 33, and are exposed on the front surface 7 of the semiconductor substrate 2.

Also, in the front surface portion of the p-type base region 34, a p$^+$-type base contact region 37 is formed lateral to the n$^+$-type emitter region 35 (on the opposite side to the gate trench 33). The dopant concentration of the p$^+$-type base contact region 37 is, for example, $5 \times 10^{18}$ cm$^{-3}$ to $1 \times 10^{20}$ cm$^{-3}$.

The n$^+$-type emitter region 35, as shown in FIG. 5A and FIG. 5B, selectively has a pullout portion 38 pulled out in the transverse direction along the front surface 7 of the semiconductor substrate 2 from the side surface of the gate trench 33. The pullout portion 38 is, for example, disposed spaced at fixed intervals along the longitudinal direction of the gate trench 33. When a pair of n$^+$-type emitter regions 35 are provided for the gate trench 33 as in the present embodiment, the pullout portions 38 of the respective n$^+$-type emitter regions 35 may be, as shown in FIG. 5B, disposed so that one and the other end portions are opposed to each other across the gate trench 33, or end portions of one pullout portion 38 and end portions of the other pullout portion 38 may be disposed alternately along the longitudinal direction of the gate trench 33 (not shown). Thereby, a part adjacent to the pullout region 38 in the p$^+$-type base contact region 37 serves as a constricted portion 39 selectively having a narrower width than that of the remaining part.

Also, in the interlayer film 23, a contact hole 36 is formed to selectively expose the p$^+$-type base contact region 37 and the n$^+$-type emitter region 35. The n$^+$-type emitter region 35 is selectively exposed at the pullout portion 38 from the contact hole 36. The emitter electrode 25 is connected to the p$^+$-type base contact region 37 and the n$^+$-type emitter region 35 via the contact hole 36.

Also by this semiconductor device 31, the same effects as those of the semiconductor device 1 of the first embodiment can be achieved.

Figure 6:
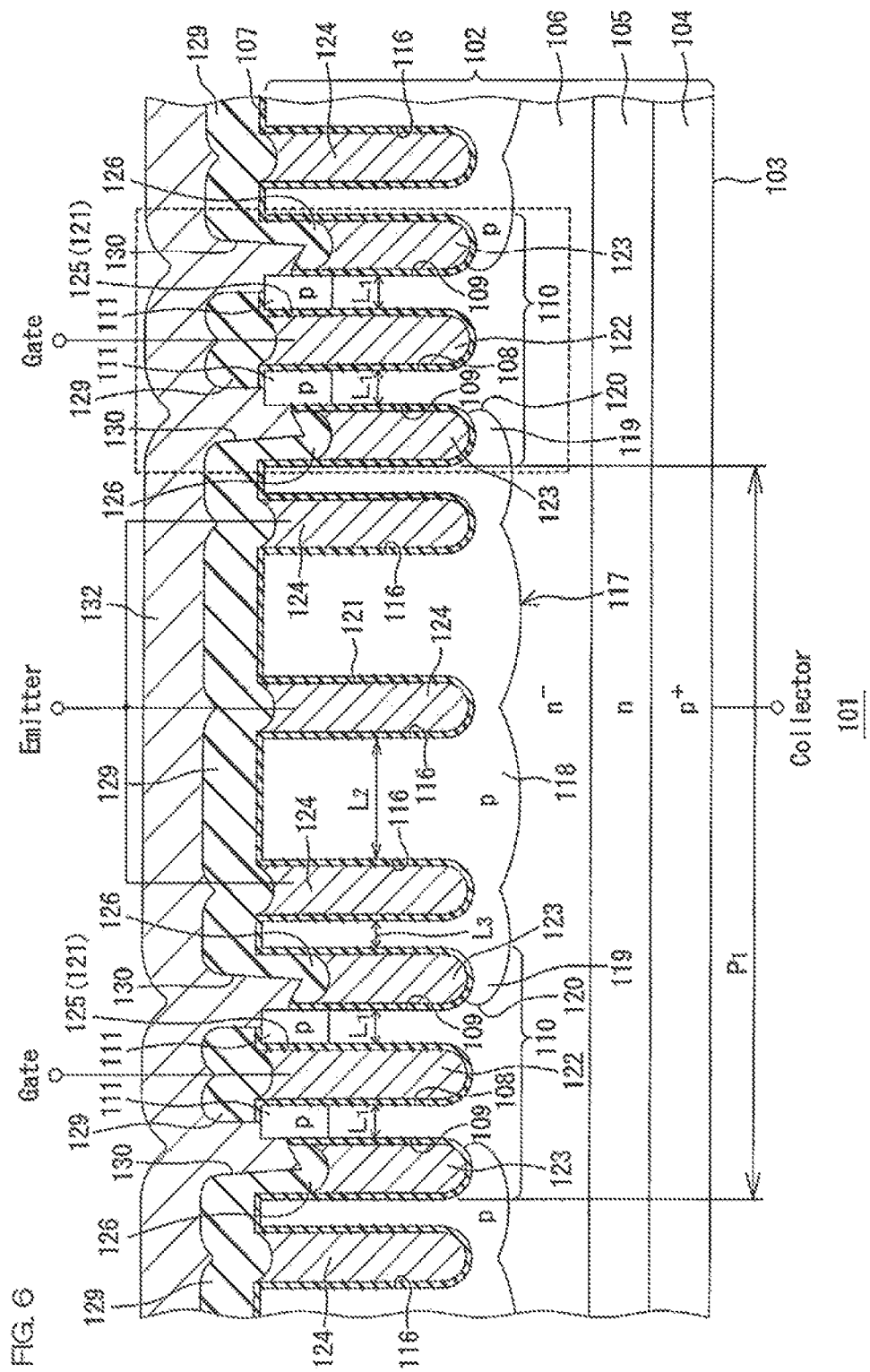
FIG. 6 is a schematic sectional view of a semiconductor device according to a third embodiment of the present invention.

FIG. 6 is a schematic sectional view of a semiconductor device 101 according to a third embodiment of the present invention. FIG. 7 is an enlarged view of a part enclosed by a broken line of FIG. 6.

The semiconductor device 101 is a device including IGBTs, and includes a semiconductor substrate 102 as an example of a semiconductor layer of the present invention. The semiconductor substrate 102 may be, for example, an n$^-$-type silicon substrate having a thickness of 50 μm to 200 μm.

The semiconductor substrate 102 has a structure in which a p$^+$-type collector region 104, an n-type buffer region 105, and an n$^-$-type drift region 106 are stacked in order from the side of its back surface 103. The p$^+$-type collector region 104 is exposed over the entire back surface 103 of the semiconductor substrate 102, and the n$^-$-type drift region 106 is selectively exposed on a part of a front surface 107 of the semiconductor substrate 102.

As a p-type dopant of the p$^+$-type collector region 104, for example, B (boron), Al (aluminum), and others can be used (the same applies to the following). On the other hand, as an n-type dopant of the n-type buffer region 105 and the n$^-$-type drift region 106, for example, N (nitrogen), P (phosphorus), As (arsenic), and others can be used (the same applies to the following).

Also, the dopant concentration of the p$^+$-type collector region 104 is, for example, $1 \times 10^{15}$ cm$^{-3}$ to $2 \times 10^{19}$ cm$^{-3}$. On the other hand, the dopant concentration of the n-type buffer region 105 is, for example, $1 \times 10^{15}$ cm$^{-3}$ to $5 \times 10^{17}$ cm$^{-3}$, and the dopant concentration of the n$^-$-type drift region 106 is $1 \times 10^{13}$ cm$^{-3}$ to $5 \times 10^{14}$ cm$^{-3}$.

On the side of the front surface 107 of the semiconductor substrate 102, a plurality of gate trenches 108 and a plurality of dummy trenches 109 are formed adjacent to each other. In the present embodiment, a trench unit 110 including a pair of dummy trenches 109 and a gate trench 108 sandwiched between the pair of dummy trenches 109 is disposed in plural numbers spaced at intervals in the transverse direction along the front surface 107 of the semiconductor substrate 102. The gate trenches 108 and the dummy trenches 109 are thereby formed in a stripe form as a whole.

The pitch $P_1$ of mutually adjacent trench units 110 is, for example, 2 μm to 7 μm. Also, in each trench unit 110, the intervals $L_1$ between the gate trench 108 and the dummy trenches 109 on both sides thereof (distances between side surfaces of the gate trench 108 and side surfaces of the dummy trenches 109) are preferably respectively 2 μm or less.

In each trench unit 100, on both sides of the gate trench 108 (regions between the same and the respective dummy trenches 109), a p-type base region 111 is formed, and further, an n$^+$-type emitter region 112 and a p$^+$-type base contact region 113 are formed in a front surface portion of the p-type base region 111 (refer to FIG. 7). In the present embodiment, an interface between the p-type base region 111 and the n$^-$-type drift region 106 is set in a central portion or upper portion of the gate trench 108, and the p-type base region 111 is formed by diffusion at a relatively shallow position of the semiconductor substrate 102.

The n$^+$-type emitter region 112 and the p$^+$-type base contact region 113 are disposed adjacent to each other in the region between the gate trench 108 and the dummy trench 109. Specifically, n$^+$-type emitter regions 112 are formed one each along both side surfaces 114 of the gate trench 108, and p$^+$-type base contact regions 113 are formed one each along side surfaces 115 of the respective dummy trenches 109. The n$^+$-type emitter regions 112 are thereby exposed on the front surface 107 of the semiconductor substrate 102 and the side surfaces 114 of the gate trenches 108. On the other hand, the p$^+$-type base contact regions 113 are exposed on the front surface 107 of the semiconductor substrate 102 and the side surfaces 115 of the dummy trenches 109.

Also, the dopant concentration of the p-type base region 111 is, for example, $1 \times 10^{16}$ cm$^{-3}$ to $1 \times 10^{18}$ cm$^{-3}$. The dopant concentration of the n$^+$-type emitter region 112 is $1 \times 10^{19}$ cm$^{-3}$ to $5 \times 10^{20}$ cm$^{-3}$. The dopant concentration of the p$^+$-type base contact region 113 is, for example, $5 \times 10^{18}$ cm$^{-3}$ to $1 \times 10^{20}$ cm$^{-3}$.

Also, between trench units 110 adjacent on the side of the front surface 107 of the semiconductor substrate 102, a plurality of (in FIG. 6, three) emitter trenches 116 are formed. In the present embodiment, the plurality of emitter trenches 116 are formed in, for example, a stripe form (parallel to the gate trenches 108 and the dummy trenches 109), and disposed spaced at mutually equal intervals in the transverse direction along the front surface 107 of the semiconductor substrate 102. The interval $L_2$ of mutually adjacent emitter trenches 116 (distance between side surfaces of the emitter trenches 116) is, for example, 3 μm or less, and preferably, 0.8 μm to 3 μm. Also, the plurality of emitter trenches 116 are formed at the same depth as that of the gate trenches 108 and the dummy trenches 109. Because the emitter trenches 116 can thereby be formed by the same step as that for the gate trenches 108 and the dummy trenches 109, the manufacturing process can be simplified.

Out of the plurality of emitter trenches 116, a trench that is adjacent to the dummy trench 109 (trench that is opposed to the dummy trench 109 via no trench therewith) is disposed at an interval $L_3$ (distance between the side surface of the emitter trench 116 and the side surface of the dummy trench 109) of 0.5 μm to 20 μm with the dummy trench 109.

Also, in the semiconductor substrate 102, a p-type floating region 117 is formed. The p-type floating region 117 spreads over a region sandwiched by the dummy trenches 109 of mutually adjacent trench units 110, opposed via the emitter trenches 116. The p-type floating region 117 is a semiconductor region where a floating state is electrically maintained, and is separated from the gate trench 108 by the dummy trench 109 that is adjacent to the gate trench 108. The p-type floating region 117 is, in the present embodiment, formed deeper than the p-type base region 111.

The p-type floating region 117 has a bottom portion 118 that bulges to the side of the back surface 103 of the semiconductor substrate 102 with respect to a bottom portion of the emitter trenches 116 and an overlap portion 119 that goes around to the lower side of the dummy trench 109. The overlap portion 119 has an end portion 120 positioned on a side closer to the gate trench 108 with respect to the center in the width direction of said dummy trench 109. The end portion 120 is preferably not projecting to the side of the gate trench 108 with respect to the emitter trench 116.

Also, the dopant concentration of the p-type floating region 117 is, for example, $5 \times 10^{15}$ cm$^{-3}$ to $1 \times 10^{18}$ cm$^{-3}$.

In the gate trenches 108, the dummy trenches 109, and the emitter trenches 116, gate electrodes 122, first buried electrodes 123, and second buried electrodes 124 are filled, respectively, via an insulating film 121 (for example, silicon oxide (SiO$_2$)). The gate electrodes 122, the first buried electrodes 123, and the second buried electrodes 124 are made of, for example, a conductive material such as polysilicon. The insulating film 121 is integrally formed along inner surfaces of the gate trenches 108, inner surfaces of the dummy trenches 109, the front surface 107 of the semiconductor substrate 102, and inner surfaces of the emitter trenches 116. The part of the insulating film 121 in the gate trench 108 serves as a gate insulating film 125. Also, the first buried electrodes 123 and the second buried electrodes 124 are electrically connected to an emitter electrode 132 to be described later.

Also, in the present embodiment, the gate electrode 122 and the second buried electrode 124 fill back their respective trenches 108 and 116 up to the opening ends, whereas the first buried electrode 123 fills back the dummy trench 109 halfway in the depth direction thereof. In the dummy trench 109, a space without an electrode is thereby formed in a region over the first buried electrode 123. Moreover, a buried insulating film 126 is filled in the dummy trench 109 so as to fill back the space up to the opening end.

The buried insulating film 126 is made of, for example, an insulating material such as boron phosphorus silicate glass (BPSG) or silicon oxide ($SiO_2$), and has a thickness of 0.5 µm or more. In the buried insulating film 126 and the insulating film 121 thereunder, a removal portion 127 is selectively formed to expose the $p^+$-type base contact region 113 on the side surface 115 of the dummy trench 109. That is, the buried insulating film 126 selectively has an upper surface 128 that is at a position lower than that of the front surface 107 of the semiconductor substrate 102 so as to be continuous from the side surface 115 of the dummy trench 109, and the $p^+$-type base contact region 113 is exposed in a region of the side surface 115 of the dummy trench 109 between the upper surface 128 and the front surface 107.

On the front surface 107 of the semiconductor substrate 102, an interlayer film 129 made of, for example, an insulating material such as boron phosphorus silicate glass (BPSG) or silicon oxide ($SiO_2$) is stacked. The interlayer film 129 is formed integrally with the buried insulating film 126. In the interlayer film 129, a contact hole 130 is formed extending across the front surface 107 of the semiconductor substrate 102 and the opening end of the dummy trench 109. The contact hole 130 exposes the $n^+$-type emitter region 112 and the $p^+$-type base contact region 113 at the front surface 107 of the semiconductor substrate 102, and exposes the $p^+$-type base contact region 113 at the side surface 115 (removal portion 127) of the dummy trench 109. That is, the $p^+$-type base contact region 113 is exposed in a corner portion 131 of the dummy trench 109 defined by intersection of the front surface 107 and the side surface 115. In addition, the $n^+$-type emitter region 112 may selectively have a pullout portion pulled out in the transverse direction along the front surface 107 of the semiconductor substrate 102 from the side surface 114 of the gate trench 108, and only the pullout portion may be selectively exposed from the contact hole 130.

On the interlayer film 129, an emitter electrode 132 as an example of a contact electrode of the present invention is stacked. The emitter electrode 132 enters the contact hole 130, and is connected to the $n^+$-type emitter region 112 on the front surface 107 of the semiconductor substrate 102, and is connected to the $p^+$-type base contact region 113 in the corner portion 131 of the dummy trench 109.

Next, a manufacturing method of the semiconductor device 101 will be explained. FIG. 8A to FIG. 8K are views for explaining the manufacturing process of the semiconductor device 101 of FIG. 6 and the FIG. 7 in the order of steps. In addition, FIG. 8A to FIG. 8F show sections corresponding to FIG. 6, and FIG. 8G to FIG. 8K show sections corresponding to FIG. 7.

For manufacturing the semiconductor device 101, as shown in FIG. 8A, a mask 160 is formed on the front surface 107 of the $n^-$-type semiconductor substrate 102 ($n^-$-type drift region 106). In the mask 160, there is formed an opening to selectively expose a region that needs to be formed into the p-type floating region 117 in the front surface 107. Then, via the mask 160, a p-type dopant is ion-implanted into the front surface 107 of the semiconductor substrate 102. An ion-implanted region 161 is thereby formed.

Next, as shown in FIG. 8B, by the semiconductor substrate 102 being selectively etched, the gate trenches 108, the dummy trenches 109, and the emitter trenches 116 are simultaneously formed.

Figure 8C:
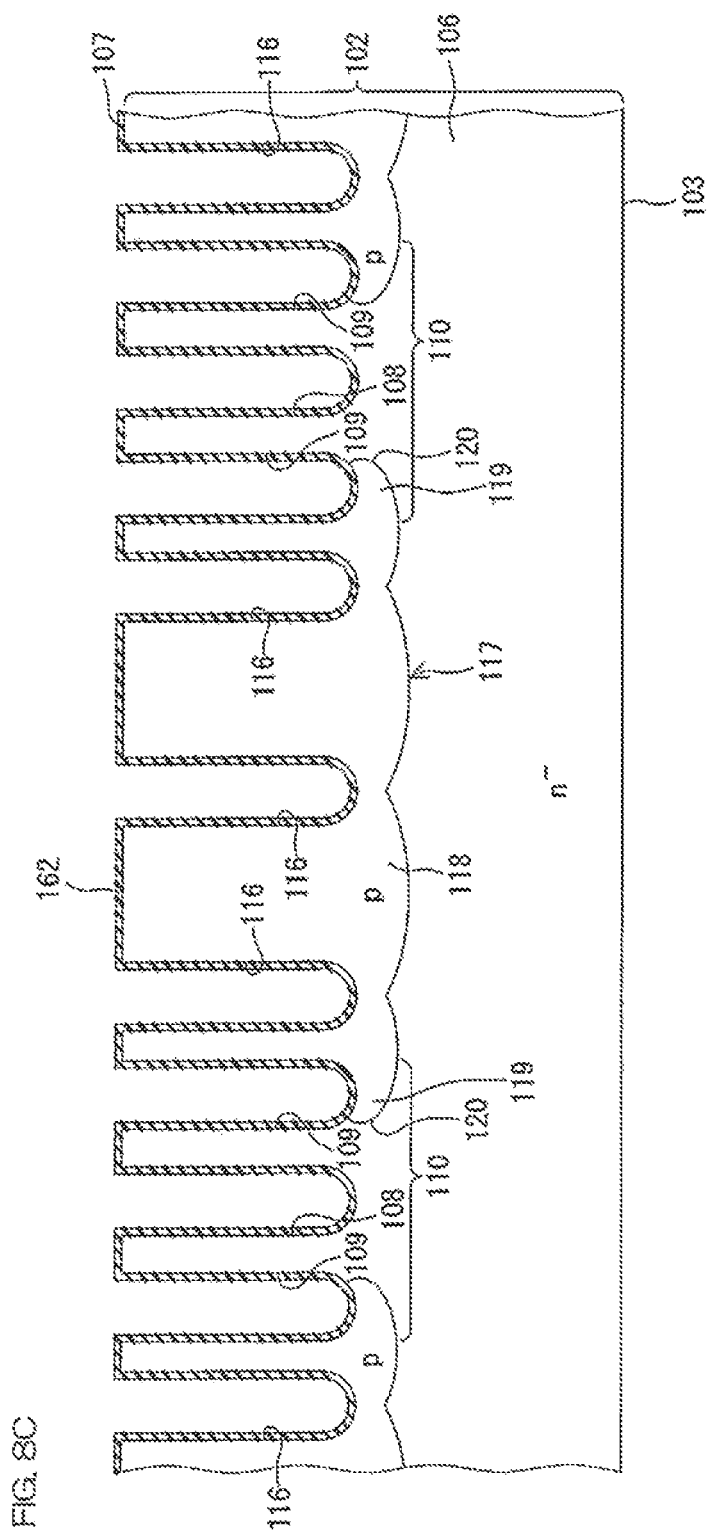
FIG. 8C is a view showing a following step of FIG. 8B.

Next, as shown in FIG. 8C, by the semiconductor substrate 102 being thermally oxidized, a sacrificial oxide film 162 is formed on the entire area of the front surface including the inner surfaces of the gate trenches 108, the dummy trenches 109, and the emitter trenches 116. Then, by annealing the semiconductor substrate 102 covered with the sacrificial oxide film 162, the p-type dopant in the ion-implanted region 161 is diffused (driven in). The annealing treatment is performed on a condition that the p-type dopant goes around to the lower side of the dummy trench 109. The p-type floating region 117 is thereby formed. In this case, because the semiconductor substrate 102 is covered with the sacrificial oxide film 162, ion seeping from the front surface of the substrate can be prevented, so that the p-type dopant can be efficiently diffused.

Figure 8D:
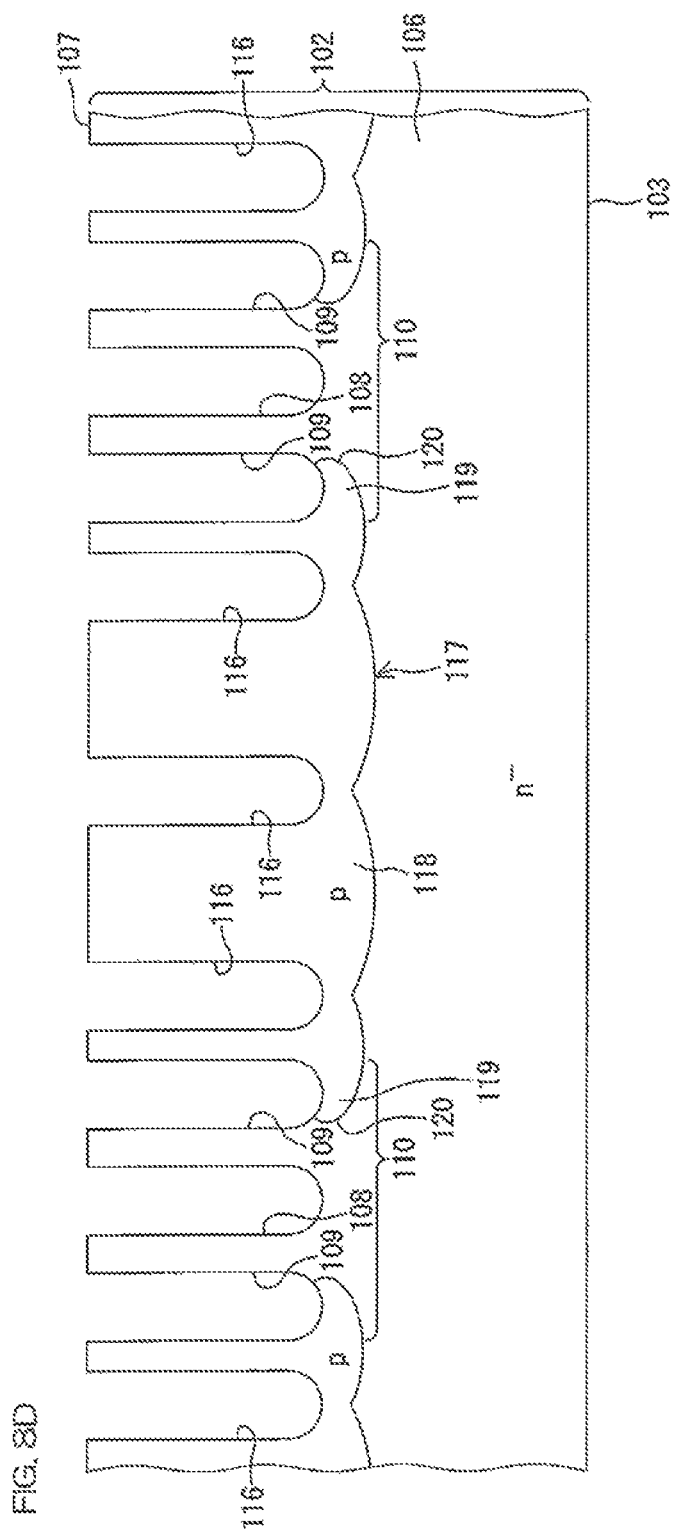
FIG. 8D is a view showing a following step of FIG. 8C.

Next, as shown in FIG. 8D, the sacrificial oxide film 162 is stripped.

Figure 8E:
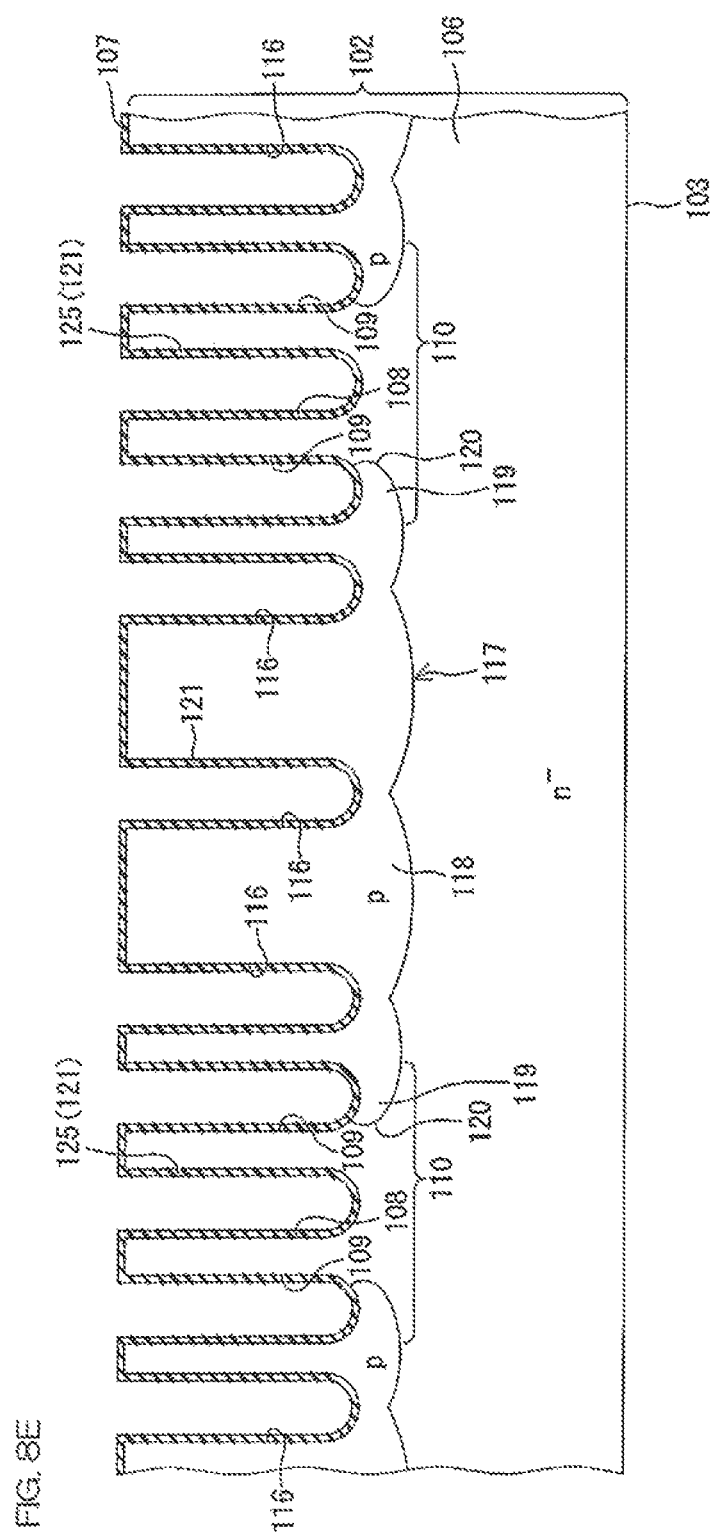
FIG. 8E is a view showing a following step of FIG. 8D.

Next, as shown in FIG. 8E, by the semiconductor substrate 102 being thermally oxidized, the insulating film 121 (gate insulating film 125) is formed on the entire area of the front surface including the inner surfaces of the gate trenches 108, the dummy trenches 109, and the emitter trenches 116.

Figure 8F:
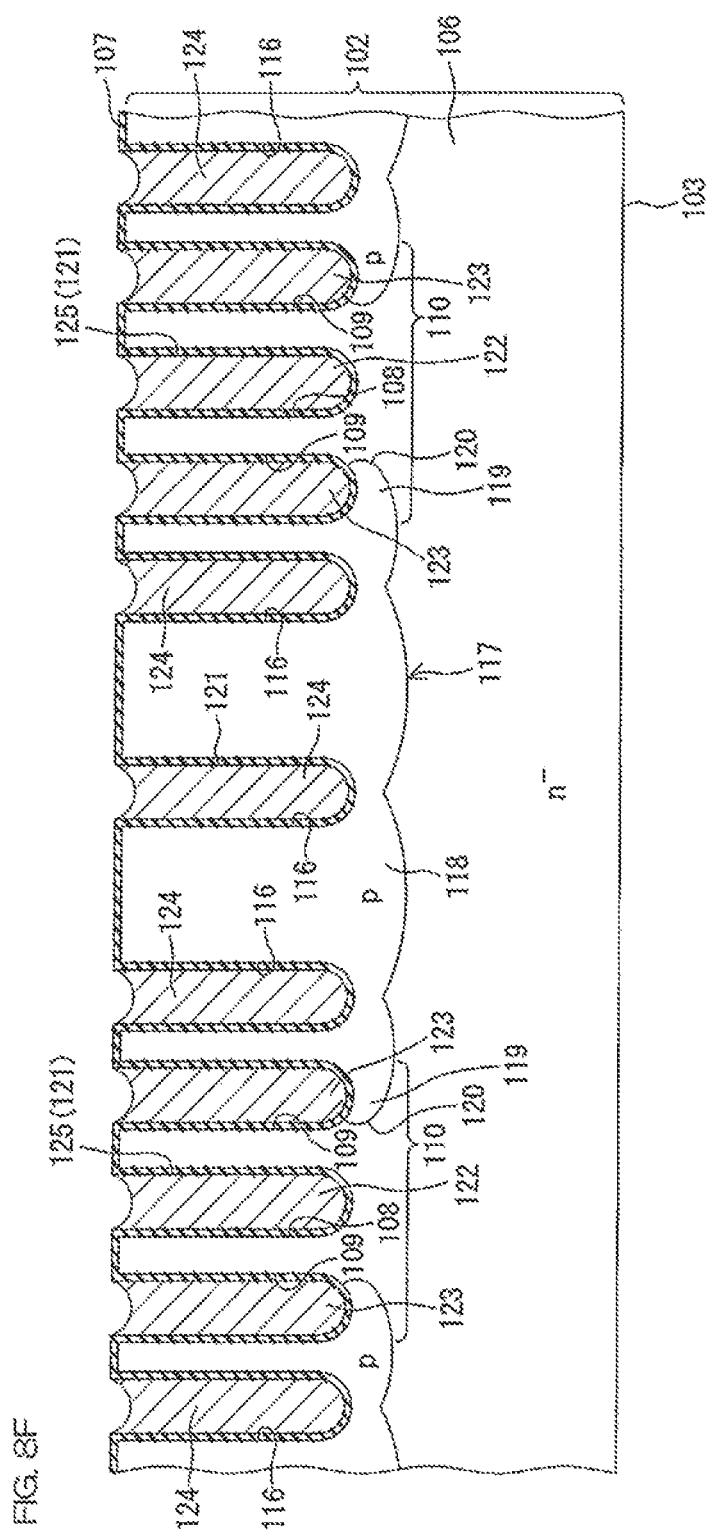
FIG. 8F is a view showing a following step of FIG. 8E.
Figure 8:
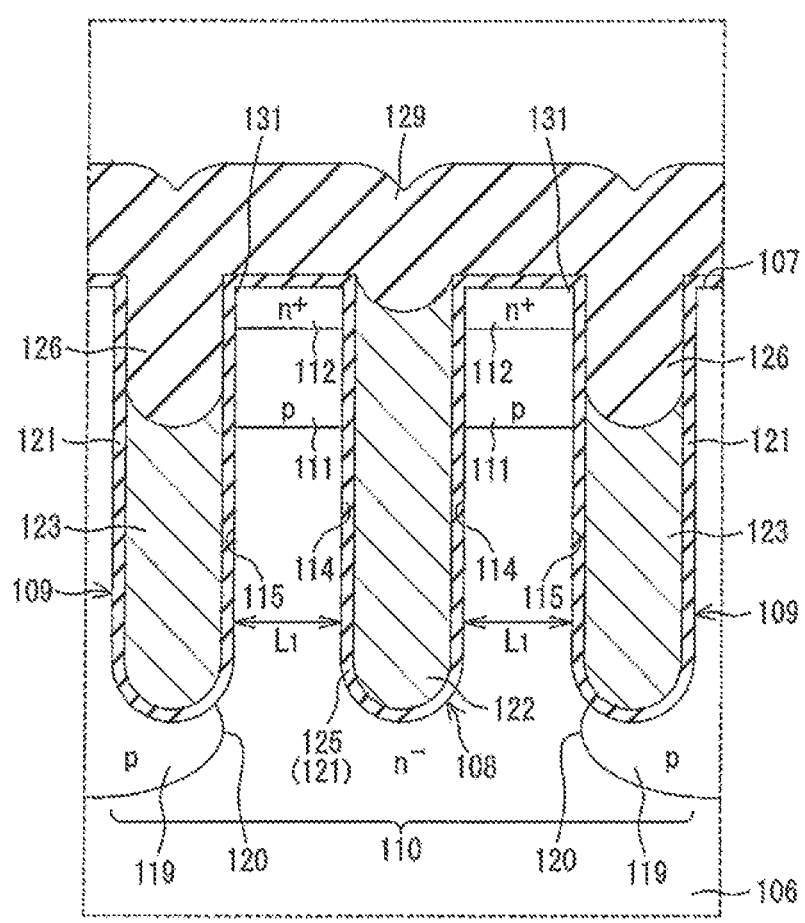
FIG. 8A is a view for explaining a manufacturing step of the semiconductor device of FIG. 7.
FIG. 8B is a view showing a following step of FIG. 8A.
FIG. 8G is a view showing a following step of FIG. 8F.
FIG. 8H is a view showing a following step of FIG. 8G.
FIG. 8I is a view showing a following step of FIG. 8H.
FIG. 8J is a view showing a following step of FIG. 8I.
FIG. 8K is a view showing a following step of FIG. 8J.

Next, as shown in FIG. 8F, an electrode material such as polysilicon is filled in the gate trenches 108, the dummy trenches 109, and the emitter trenches 116. The gate electrodes 122, the first buried electrodes 123, and the second buried electrodes 124 are thereby simultaneously formed.

Next, as shown in FIG. 8G, by n-type and p-type dopants being selectively ion-implanted and diffused into the front surface 107 of the semiconductor substrate 102, the p-type base regions 111 and the $n^+$-type emitter regions 112 are formed in order.

Next, as shown in FIG. 8H, by etching the first buried electrodes 123 from upper surfaces, the filled states of the gate electrodes 122 and the second buried electrodes 124 are kept maintained, while only the first buried electrodes 123 are selectively dug down.

Next, as shown in FIG. 8I, by depositing an insulating material such as boron phosphorus silicate glass (BPSG) or silicon oxide ($SiO_2$) on the front surface 107 of the semiconductor substrate 102, the spaces over the first buried electrodes 123 are filled back with said insulating material, and the front surface 107 is covered with said insulating material. The buried insulating film 126 and the interlayer film 129 are thereby simultaneously formed.

Next, as shown in FIG. 8J, by selectively etching the interlayer film 129 and the buried insulating film 126, the contact holes 130 and the removal portions 127 are simultaneously formed.

Next, as shown in FIG. 8K, a p-type dopant is selectively ion-implanted and diffused into the front surface 107 of the semiconductor substrate 102 exposed in the contact holes 130. The $p^+$-type base contact regions 113 are thereby formed.

Thereafter, by n-type and p-type dopants being selectively ion-implanted and diffused into the back surface 103 of the semiconductor substrate 102 after the emitter electrode 132 and the like being formed on the side of the front surface 107 of the semiconductor substrate 102, the n-type buffer region 105 and the $p^+$-type collector region 104 are formed in order.

Through the steps as above, the semiconductor device 101 shown in FIG. 6 and FIG. 7 is obtained. However, FIG. 8A to FIG. 8K merely represent a part of the manufacturing process of the semiconductor device 101, and said manufacturing process may include steps not shown by FIG. 8A to FIG. 8K.

According to this semiconductor device 101, because the side surface 115 of the dummy trench 109 can be effectively used as the p$^+$-type base contact region 113, a junction area of the emitter electrode 132 with respect to the p-type base region 111 can be sufficiently secured by both surfaces of the front surface 107 of the semiconductor substrate 102 and the side surface 115 of the dummy trench 109. Because a plane area of the p-type base region 111 can thereby be sacrificed, the interval $L_1$ between the gate trench 108 and the dummy trench 109 can be miniaturized to form a p-type base region 111 more minute than the conventional p-type base region. Furthermore, because the dummy trenches 109 can be formed using the same mask as that for the gate trenches 108, misalignment with respect to the gate trenches 108 does not occur. Moreover, alignment of the emitter electrode 132, for which alignment with an area including a plane area of the dummy trenches 109 suffices, can thus be easily attained.

Specifically, first, by etching the semiconductor substrate 102 using the same mask, the gate trenches 108, the dummy trenches 109, and the emitter trenches 116 are simultaneously formed (FIG. 8B). Next, by filling polysilicon in the trenches 108, 109, and 116, the gate electrodes 122, the first buried electrodes 123, and the second buried electrodes 124 are formed (FIG. 8F). Next, a mask to selectively expose the dummy trenches 109 is formed on the semiconductor substrate 102, and via the mask, an upper portion of the polysilicon in the dummy trenches 109 is selectively removed by etching. Spaces are thereby formed in regions over the first buried electrodes 123 of the dummy trenches 109 (FIG. 8H). Next, the interlayer film 129 is formed by depositing on the semiconductor substrate 102 an insulating material such as BPSG by, for example, a CVD method (FIG. 8I). A part of the insulating material enters into the dummy trenches 109 as the buried insulating film 126. Next, a mask to form the contact holes 130 is aligned with respect to the semiconductor substrate 102. In this case, because end portions of the contact holes 130 may cover the dummy trenches 109, the alignment can be attained in a wide area including the front surface 107 of the semiconductor substrate 102 and a plane area of the dummy trenches 109. Then, via said mask, the interlayer film 129 and the buried insulating film 126 are continuously etched. The contact holes 130 and the removal portions 127 are thereby simultaneously formed (FIG. 8J). Thereafter, by ion-implanting a p-type dopant using the interlayer film 129 as a mask to form the p$^+$-type base contact regions 113 in a self-aligned manner, the p$^+$-type base contact regions 113 can be reliably formed in the corner portions 131 of the dummy trenches 109 (FIG. 8K). Furthermore, because the contact holes 130 can be formed relatively wide, a part of the emitter electrode 132 using aluminum (Al) or the like can be used as plugs, even without using plugs excellent in filling ability, such as tungsten (W).

As a result of miniaturization of the trench structure as above, a trade-off relationship between the short-circuit capacity and ON-voltage of the device can be improved, so that a charge enhancement effect can be increased. $V_{CE}(sat)$ in a low-current range can hence be improved.

Also, according to this semiconductor device 101, the gate trench 108 filled with the gate electrode 122 (hereinafter, referred to as a "gate junction trench") is separated from the p-type floating region 117 by the dummy trench 109 filled with the first buried electrode 123 connected to the n$^+$-type emitter region 112 (hereinafter, referred to as an "emitter junction trench"). The p-type floating region 117 and the gate junction trench can thereby be prevented from joining. A stray capacitance between the gate junction trench and the p-type floating region 117 can therefore be eliminated.

On the other hand, the n$^-$-type drift region 106 which the gate junction trench joins across the depth direction is to be grounded together with the p$^+$-type collector region 104. Therefore, at switching operation, a capacitance change between the gate junction trench and the n$^-$-type drift region 106 is stabilized, so that noise does not easily occur. As a result thereof, generation of noise and switching loss at switching operation can be reduced.

Also, because the interval $L_1$ between the emitter junction trench and the gate junction trench is 2 µm or less, withstand voltage can also be satisfactorily maintained.

Further, according to this semiconductor device 101, because the p-type floating region 117 (overlap portion 119) is formed up to a bottom portion of the emitter junction trench, a collector-emitter voltage to be loaded on the emitter junction trench at switching-off operation can be relieved. Therefore, a device breakdown can be prevented against a steep voltage change (dv/dt).

Also, because withstand voltage can be increased by the p-type floating region 117 that is deeper than the p-type base region 111, while the p-type base region 111 may be shallow, the channel length (length in the depth direction of the gate trench 108) can also be reduced to suppress a rise in ON-voltage by appropriately designing the depth of the p-type base region 111.

FIG. 9 is a schematic sectional view of a semiconductor device 141 according to a fourth embodiment of the present invention. FIG. 10 is an enlarged view of a part enclosed by a broken line of FIG. 9. In FIG. 9 and FIG. 10, parts corresponding to the respective portions shown in FIG. 6 and FIG. 7 described above will be denoted by the same reference signs.

In the foregoing third embodiment, the trench unit 110 includes a pair of dummy trenches 109 and a gate trench 108 sandwiched between the pair of dummy trenches 109. In contrast, the semiconductor device 141 of the fourth embodiment has a trench unit 144 including a pair of gate trenches 142 and a dummy trench 143 sandwiched between the pair of gate trenches 142. In this case, the interval $L_3$ between the gate trench 142 and the emitter trench 116 (distance between the side surface of the gate trench 142 and the side surface of the emitter trench 116) is preferably 2 µm or less.

In each trench unit 144, on both sides of the dummy trench 143 (regions between the same and the respective gate trenches 142), a p-type base region 145 is formed, and further, an n$^+$-type emitter region 146 and a p$^+$-type base contact region 147 are formed in a front surface portion of the p-type base region 145 (refer to FIG. 10). In the present embodiment, an interface between the p-type base region 145 and the n$^-$-type drift region 106 is set in a central portion or upper portion of the gate trench 142, and the p-type base region 145 is formed by diffusion at a relatively shallow position of the semiconductor substrate 102.

The n$^+$-type emitter region 146 and the p$^+$-type base contact region 147 are disposed adjacent to each other in the region between the gate trench 142 and the dummy trench 143. Specifically, n$^+$-type emitter regions 146 are formed one each along side surfaces 148 of the respective gate trenches 142, and p$^+$-type base contact regions 147 are formed one each along both side surfaces 149 of the dummy trench 143. The n$^+$-type emitter regions 146 are thereby exposed on the front surface 107 of the semiconductor substrate 102 and the side surfaces 148 of the gate trenches 142. On the other hand, the p$^+$-type base contact regions 147 are exposed on the front surface 107 of the semiconductor substrate 102 and the side surfaces 149 of the dummy trenches 143.

Also, in the semiconductor substrate 102, a p-type floating region 150 is formed. The p-type floating region 150 spreads over each section between the plurality of emitter trenches 116. The p-type floating region 150 is a semiconductor region where a floating state is electrically maintained, and is separated from the gate trench 142 by the emitter trench 116 that is adjacent to the gate trench 142. The p-type floating region 150 is, in the present embodiment, formed deeper than the p-type base region 145.

The p-type floating region 150 has a bottom portion 151 that bulges to the side of the back surface 103 of the semiconductor substrate 102 with respect to a bottom portion of the emitter trenches 116 and an overlap portion 152 that goes around to the lower side of the emitter trench 116 adjacent to the gate trench 142. The overlap portion 152 has an end portion 153 positioned on a side closer to the gate trench 142 with respect to the center in the width direction of said emitter trench 116. The end portion 153 is preferably not projecting to the side of the gate trench 142 with respect to the emitter trench 116.

Such a p-type floating region 150 can be formed, for example, in the same manner as the foregoing p-type floating region 117.

In the dummy trench 143, a first buried electrode 154 is filled via an insulating film 121. The first buried electrode 154 is made of, for example, a conductive material such as polysilicon, and is electrically connected to the gate electrode 122. Also, the first buried electrode 154 fills back the dummy trench 143 halfway in the depth direction thereof. In the dummy trench 143, a space without an electrode is thereby formed in a region over the first buried electrode 154. Moreover, a buried insulating film 155 is filled in the dummy trench 143 so as to fill back the space up to the opening end.

The buried insulating film 155 is made of, for example, an insulating material such as boron phosphorus silicate glass (BPSG) or silicon oxide (SiO$_2$), and has a thickness of 0.5 μm or more. In the buried insulating film 155 and the insulating film 121 thereunder, a removal portion 156 is selectively formed to expose the p$^+$-type base contact regions 147 on both side surfaces 149 of the dummy trench 143. That is, the buried insulating film 155 selectively has an upper surface 157 that is at a position lower than that of the front surface 107 of the semiconductor substrate 102 so as to be continuous from both side surfaces 149 of the dummy trench 143, and the p$^+$-type base contact regions 147 are exposed in a region of both side surfaces 149 of the dummy trench 143 between the upper surface 157 and the front surface 107.

In the interlayer film 129, a contact hole 158 is formed extending across the p-type base regions 145 opposed across the dummy trench 143. The contact hole 158 exposes the n$^+$-type emitter regions 146 and the p$^+$-type base contact regions 147 at the front surface 107 of the semiconductor substrate 102, and exposes the p$^+$-type base contact regions 147 at both side surfaces 149 (removal portion 156) of the dummy trench 143. That is, the p$^+$-type base contact regions 147 are exposed in both corner portions 159 of the dummy trench 143 defined by intersection of the front surface 107 and the side surfaces 149. In addition, the n$^+$-type emitter region 146 may selectively have a pullout portion pulled out in the transverse direction along the front surface 107 of the semiconductor substrate 102 from the side surface 148 of the gate trench 142, and only the pullout portion may be selectively exposed from the contact hole 158.

Moreover, the emitter electrode 132 enters the contact hole 158, and is connected to the n$^+$-type emitter regions 146 on the front surface 107 of the semiconductor substrate 102, and is connected to the p$^+$-type base contact regions 147 in both corner portions 159 of the dummy trench 143.

Also by this semiconductor device 141, the same effects as those of the semiconductor device 101 of the third embodiment can be achieved.

The embodiments of the present invention are described above, however, the present invention can also be carried out in other embodiments.

For example, the above-described features grasped from the disclosures of the respective embodiments described above may be combined with each other even among different embodiments.

Also, in the foregoing embodiments, only the arrangements of IGBTs included in the semiconductor devices 1, 31, 101, and 141 are illustrated, however, a semiconductor device of the present invention may include elements other than IGBTs (for example, MOSFETs, diodes, and the like) in a region different from a forming region of IGBTs.

Various other design modifications can be made within the scope of the matters described in the claims.

The embodiments of the present invention are merely specific examples used to clarify the technical contents of the present invention, and the present invention should not be interpreted as being limited to only these specific examples, and the spirit and scope of the present invention shall be limited only by the accompanying claims.

The present application corresponds to Japanese Patent Application No. 2012-182169 filed on Aug. 21, 2012 in the Japan Patent Office, Japanese Patent Application No. 2012-182170 filed on Aug. 21, 2012 in the Japan Patent Office, and Japanese Patent Application No. 2013-167478 filed on Aug. 12, 2013 in the Japan Patent Office, and the entire disclosures of these applications are incorporated herein by reference.

In addition, from the description of the specification and drawings, the following features can be extracted besides the inventions described in the claims.

(Section 1) A semiconductor device including a semiconductor layer, a gate trench formed in the semiconductor layer, a gate electrode filled via a gate insulating film in the gate trench, a dummy trench formed spaced at a predetermined interval lateral to the gate trench, an n$^+$-type emitter region, a p-type base region, and an n$^-$-type drift region disposed, in a region between the gate trench and the dummy trench, in order in a depth direction of the gate trench from a front surface side of the semiconductor layer, a p$^+$-type collector region disposed on a back surface side of the semiconductor layer with respect to the n$^-$-type drift region, a buried insulating film being a buried insulating film filled in the dummy trench and having an upper surface at a bottom side of the dummy trench with respect to the front surface of the semiconductor layer, for selectively exposing as a contact region a part of the p-type base region at a part from the front surface to the upper surface in a side surface of the dummy trench, and a contact electrode filled in a region over the buried insulating film of the dummy trench, connected to the contact region on the side surface of the dummy trench.

According to this arrangement, because the side surface of the dummy trench can be effectively used as the contact region, a junction area of the contact electrode with respect to the p-type base region can be sufficiently secured. Because a plane area of the p-type base region can thereby be sacrificed, the interval between the gate trench and the dummy trench can be miniaturized to form a p-type base region more minute than the conventional p-type base region. Furthermore, because the dummy trench can be formed using the same mask as that for the gate trench, misalignment with respect to the gate trench does not occur. Moreover, alignment of the contact electrode, for which alignment with an area including a plane area of the dummy trench suffices, can thus be easily attained.

Also, as a result of miniaturization of the trench structure, a trade-off relationship between the short-circuit capacity and ON-voltage of the device can be improved, so that a charge enhancement effect can be increased. $V_{CE}(sat)$ in a low-current range can hence be improved.

(Section 2) The semiconductor device according to section 1, wherein the semiconductor device further includes a first buried electrode filled via an insulating film in a region under the buried insulating film of the dummy trench.

(Section 3) The semiconductor device according to section 2, wherein the semiconductor device has a trench unit including a pair of the dummy trenches and a gate trench sandwiched between the pair of dummy trenches.

(Section 4) The semiconductor device according to section 3, wherein the first buried electrode is electrically connected with the $n^+$-type emitter region.

(Section 5) The semiconductor device according to section 4, wherein the trench unit is formed in plural numbers in a transverse direction along the front surface of the semiconductor layer, and the semiconductor device further includes a plurality of emitter trenches formed between the trench units adjacent to each other, a second buried electrode filled via an insulating film in the emitter trench, electrically connected with the $n^+$-type emitter region, and a p-type floating region formed between the dummy trench of the trench unit and the dummy trench of the trench unit next thereto.

(Section 6) The semiconductor device according to section 5, wherein the p-type floating region is formed deeper than the p-type base region, and includes an overlap portion that goes around to a lower side of the dummy trench.

According to this arrangement, because the p-type floating region (overlap portion) is formed up to a bottom portion of the dummy trench filled with the first buried electrode connected to the $n^+$-type emitter region (hereinafter, referred to as an "emitter junction trench"), a collector-emitter voltage to be loaded on the emitter junction trench at switching-off operation can be relieved. Therefore, a device breakdown can be prevented against a steep voltage change (dv/dt).

Also, because withstand voltage can be increased by the p-type floating region that is deeper than the p-type base region, while the p-type base region may be shallow, a rise in ON-voltage can also be suppressed by appropriately designing the depth of the p-type base region.

(Section 7) The semiconductor device according to section 6, wherein the overlap portion has an end portion positioned on a side closer to the gate trench with respect to a center in a width direction of the emitter trench.

According to this arrangement, a collector-emitter voltage to be applied to the emitter junction trench can be more satisfactorily relieved.

(Section 8) The semiconductor device according to section 2, wherein the semiconductor device has a trench unit including a pair of the gate trenches and a dummy trench sandwiched between the pair of gate trenches.

(Section 9) The semiconductor device according to section 8, wherein the first buried electrode is electrically connected with the gate electrode.

(Section 10) The semiconductor device according to section 9, wherein the trench unit is formed in plural numbers in a transverse direction along the front surface of the semiconductor layer, and the semiconductor device further includes a plurality of emitter trenches formed between the trench units adjacent to each other, a second buried electrode filled via an insulating film in the emitter trench, electrically connected with the $n^+$-type emitter region, and a p-type floating region formed between the plurality of emitter trenches.

(Section 11) The semiconductor device according to section 10, wherein the p-type floating region is formed deeper than the p-type base region, and includes an overlap portion that goes around to a lower side of the emitter trench.

According to this arrangement, because the p-type floating region (overlap portion) is formed up to a bottom portion of the emitter trench filled with the second buried electrode connected to the $n^+$-type emitter region (hereinafter, referred to as an "emitter junction trench"), a collector-emitter voltage to be loaded on the emitter junction trench at switching-off operation can be relieved. Therefore, a device breakdown can be prevented against a steep voltage change (dv/dt).

Also, because withstand voltage can be increased by the p-type floating region that is deeper than the p-type base region, while the p-type base region may be shallow, a rise in ON-voltage can also be suppressed by appropriately designing the depth of the p-type base region.

(Section 12) The semiconductor device according to section 11, wherein the overlap portion has an end portion positioned on a side closer to the gate trench with respect to a center in a width direction of the emitter trench.

According to this arrangement, a collector-emitter voltage to be applied to the emitter junction trench can be more satisfactorily relieved.

(Section 13) The semiconductor device according to any one of sections 1 to 12, wherein the buried insulating film has a thickness of 0.5 μm or more.

(Section 14) The semiconductor device according to any one of sections 1 to 13, wherein the dummy trench is disposed at an interval of 2 μm or less with the gate trench.

(Section 15) The semiconductor device according to any one of sections 1 to 14, wherein the $n^+$-type emitter region has an n-type dopant concentration of $1\times10^{19}$ cm$^{-3}$ to $5\times10^{20}$ cm$^{-3}$.

(Section 16) The semiconductor device according to any one of sections 1 to 15, wherein the p-type base region has a p-type dopant concentration of $1\times10^{16}$ cm$^{-3}$ to $1\times10^{18}$ cm$^{-3}$.

(Section 17) The semiconductor device according to any one of sections 1 to 16, wherein the $n^-$-type drift region has an n-type dopant concentration of $1\times10^{13}$ cm$^{-3}$ to $5\times10^{14}$ cm$^{-3}$.

(Section 18) The semiconductor device according to any one of sections 1 to 17, wherein the $p^+$-type collector region has a p-type dopant concentration of $1\times10^{15}$ cm$^{-3}$ to $2\times10^{19}$ cm$^{-3}$.

EXAMPLES

Next, the present invention will be described based on examples, but the present invention is not limited by the following examples.

$V_{CE}$–$I_{Cf}$ characteristics of four types of devices that are mutually different in the interval $L_1$ between the gate trench 108 and the dummy trench 109 were examined, regarding the structure of the semiconductor device 101 shown in FIG. 6, in order to confirm how the effect to improve the trade-off relationship between the short-circuit capacity and ON-voltage ($V_{CE}$) changes depending on said interval $L_1$. The result is shown in FIG. 11. In FIG. 11, device A (trench interval $L_1$=2 μm: alternate long and short dashed line) and device C (trench interval $L_1$=3.5 μm: broken line) are shown.

According to FIG. 11, it could be confirmed that the narrower the trench interval $L_1$, the lower $V_{CE}$(sat) at rising and the lower steady loss (refer to the lower right enlarged view of FIG. 11). Also, it could be confirmed that in a high-current range of $I_{Cf}$, the saturation current density has been lowered by trench miniaturization (a reduction in volume of the p-type base region 111), and the short-circuit capacity has been increased.

The invention claimed is:

1. A semiconductor device comprising:
    a semiconductor layer;
    a plurality of gate trenches formed in the semiconductor layer;
    a gate electrode filled via a gate insulating film in the plurality of gate trenches;
    an n⁺-type emitter region, a p-type base region, and an n⁻-type drift region disposed laterally to each gate trench, in order in a depth direction of the gate trench from a front surface side of the semiconductor layer, the n⁺-type emitter region, the p-type base region, and the n⁻-type drift region forming a transistor cell region;
    a p⁺-type collector region disposed on a back surface side of the semiconductor layer with respect to the n⁻-type drift region;
    a plurality of emitter trenches formed between the plurality of gate trenches adjacent to each other;
    a buried electrode filled via an insulating film in the plurality of emitter trenches, electrically connected with the n⁺-type emitter region;
    a dummy trench formed between each of the gate trenches and each adjacent emitter trench such that the n+-type emitter region, the p-type base region, and the n⁻-type drift region are formed between the dummy trench and the gate trench;
    a buried insulating film filled in the dummy trench and having an upper surface with a portion offset towards a bottom side of the dummy trench with respect to the front surface of the semiconductor layer, for selectively exposing as a contact region a part of the p-type base region at a part from the front surface of the semiconductor layer to the upper surface of the buried insulating film in a side surface of the dummy trench; and
    a contact electrode filled in a region over the buried insulating film of the dummy trench, connected to the contact region on the side surface of the dummy trench,
    wherein each gate trench is sandwiched between the plurality of emitter trenches such that a non-transistor cell region is formed between each of the gate trenches and each adjacent emitter trench,
    wherein the transistor cell region and the non-transistor cell region are formed alternatively along the front surface of the semiconductor layer,
    wherein the n⁺-type emitter region selectively has a pullout portion pulled out in a transverse direction along the front surface of the semiconductor layer from a side surface of the gate trench, and
    the semiconductor device further comprising an n-type buffer region disposed between a part of the n⁻-type drift region and the p⁺-type collector region.

2. The semiconductor device according to claim 1, further comprising a p-type region formed between the plurality of emitter trenches, wherein
    the p-type region is formed deeper than the p-type base region, and includes an overlap portion that goes around to a lower side of an emitter trench closest to the gate trench out of the plurality of emitter trenches and has an end portion positioned on a side closer to the gate trench with respect to a center in a width direction of the emitter trench, and
    wherein a part of the n⁻-type drift region is disposed below the p-type region.

3. The semiconductor device according to claim 2, wherein the p-type region includes a p-type floating region in which a floating state is electrically maintained.

4. The semiconductor device according to claim 2, wherein the p-type region has a bottom portion that bulges to the back surface side of the semiconductor layer with respect to a bottom portion of the emitter trench.

5. The semiconductor device according to claim 1, wherein each of the plurality of emitter trenches is formed at a same depth as that of each of the plurality of gate trenches.

6. The semiconductor device according to claim 1, wherein the gate trenches are disposed in adjacent pairs, each in a transverse direction along the front surface of the semiconductor layer, and
    each pair of gate trenches are opposed in the transverse direction via the p-type base region that is common thereto.

7. The semiconductor device according to claim 6, wherein one of the pair of gate trenches is disposed at an interval of 2 μm to 7 μm with respect to the other.

8. The semiconductor device according to claim 1, wherein the n⁺-type emitter region has an n-type dopant concentration of $1\times10^{19}$ cm⁻³ to $5\times10^{20}$ cm⁻³.

9. The semiconductor device according to claim 1, wherein the p-type base region has a p-type dopant concentration of $1\times10^{16}$ cm⁻³ to $1\times10^{18}$ cm⁻³.

10. The semiconductor device according to claim 1, wherein the n⁻-type drift region has an n-type dopant concentration of $1\times10^{13}$ cm⁻³ to $5\times10^{14}$ cm⁻³.

11. The semiconductor device according to claim 1, wherein the p⁺-type collector region has a p-type dopant concentration of $1\times10^{15}$ cm⁻³ to $2\times10^{19}$ cm⁻³.

12. The semiconductor device according to claim 1, wherein the n⁺-type emitter regions are formed one each along both side surfaces of the gate trench.

13. The semiconductor device according to claim 1, wherein the pullout portion is disposed spaced at fixed intervals along a longitudinal direction of the gate trench.

14. The semiconductor device according to claim 13, wherein the pullout portions of the respective n⁺-type emitter regions are disposed so that one and another end portions are opposed to each other across the gate trench.

15. A semiconductor device comprising:
    a semiconductor layer;
    a plurality of gate trenches formed in the semiconductor layer;
    a gate electrode filled via a gate insulating film in the plurality of gate trenches;
    an n⁺-type emitter region, a p-type base region, and an n⁻-type drift region disposed laterally to each gate trench, in order in a depth direction of the gate trench from a front surface side of the semiconductor layer, the n$^+$-type emitter region, the p-type base region, and the n$^-$-type drift region forming a transistor cell region;

a p$^+$-type collector region disposed on a back surface side of the semiconductor layer with respect to the n$^-$-type drift region;

a plurality of emitter trenches formed in the semiconductor layer;

a buried electrode filled via an insulating film in the plurality of emitter trenches, electrically connected with the n$^+$-type emitter region;

a dummy trench formed between each of the gate trenches and each adjacent emitter trench such that the n+-type emitter region, the p-type base region, and the n$^-$-type drift region are formed between the dummy trench and the gate trench;

a buried insulating film filled in the dummy trench and having an upper surface with a portion offset towards a bottom side of the dummy trench with respect to the front surface of the semiconductor layer, for selectively exposing as a contact region a part of the p-type base region at a part from the front surface of the semiconductor layer to the upper surface of the buried insulating film in a side surface of the dummy trench; and a contact electrode filled in a region over the buried insulating film of the dummy trench, connected to the contact region on the side surface of the dummy trench, wherein each gate trench is sandwiched between the plurality of emitter trenches such that a non-transistor cell region is formed between the gate trench and each emitter trench, wherein the transistor cell region and the non-transistor cell region are formed alternatively along the front surface of the semiconductor layer, wherein the n$^+$-type emitter region selectively has a pullout portion pulled out in a transverse direction along the front surface of the semiconductor layer from a side surface of the gate trench, and the semiconductor device further comprising an n-type buffer region disposed between a part of the n$^-$-type drift region and the p$^+$-type collector region.

16. The semiconductor device according to claim 15, further comprising a p-type region formed at least one of between the plurality of emitter trenches, between the plurality of gate trenches, and between the emitter trench and the gate trench, wherein the p-type region is formed deeper than the p-type base region, and wherein a portion of the n$^-$-type drift region is disposed below the p-type region.

17. A method for manufacturing a semiconductor device comprising:

a step of forming a plurality of gate trenches and emitter trenches in a semiconductor layer;

a step of forming a p-type region between the plurality of emitter trenches so as to include an overlap portion that goes around to a lower side of an emitter trench closest to the gate trench out of the plurality of emitter trenches and has an end portion positioned on a side closer to the gate trench with respect to a center in a width direction of the emitter trench;

a step of filling a gate electrode via a gate insulating film in the plurality of gate trenches;

a step of filling a buried electrode via an insulating film in the plurality of emitter trenches;

a step of forming an n$^+$-type emitter region, a p-type base region, and an n$^-$-type drift region so as to be disposed laterally to each gate trench, in order in a depth direction of the gate trench from a front surface side of the semiconductor layer;

a step of forming a dummy trench between each of the gate trenches and each adjacent emitter trench such that the n+-type emitter region, the p-type base region, and the n$^-$-type drift region are formed between the dummy trench and the gate trench;

a step of filling a buried insulating film in the dummy trench, wherein the buried insulating film has an upper surface with a portion offset towards a bottom side of the dummy trench with respect to the front surface of the semiconductor layer, further wherein the buried insulating film selectively exposes as a contact region a part of the p-type base region at a part from the front surface of the semiconductor layer to the upper surface of the buried insulating film in a side surface of the dummy trench;

a step of filling a contact electrode in a region over the buried insulating film of the dummy trench, wherein the contact electrode connects to the contact region on the side surface of the dummy trench;

a step of forming a n-type buffer region on a back surface side of the semiconductor layer; and a step of forming a p$^+$-type collector region on a back surface side of the semiconductor layer with respect to the n-type buffer region, wherein the n$^+$-type emitter region selectively has a pullout portion pulled out in a transverse direction along the front surface of the semiconductor layer from a side surface of the gate trench, and wherein a part of the n$^-$-type drift region is disposed below the p-type region.

18. The method for manufacturing a semiconductor device according claim 17, wherein the p-type region is formed by diffusing a p-type dopant implanted into the semiconductor layer in advance of the forming of the plurality of emitter trenches.

* * * * *